(12) United States Patent
Staals et al.

(10) Patent No.: US 8,208,122 B2
(45) Date of Patent: Jun. 26, 2012

(54) METHOD OF MEASURING A LITHOGRAPHIC PROJECTION APPARATUS

(75) Inventors: Frank Staals, Eindhoven (NL); Gerardus Carolus Johannus Hofmans, Eindhoven (NL); Hans Van Der Laan, Veldhoven (NL); Sven Gunnar Krister Magnusson, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 450 days.

(21) Appl. No.: 12/423,570

(22) Filed: Apr. 14, 2009

(65) Prior Publication Data
US 2009/0268182 A1 Oct. 29, 2009

Related U.S. Application Data

(60) Provisional application No. 61/071,177, filed on Apr. 16, 2008.

(51) Int. Cl.
G03B 27/52 (2006.01)
G03B 27/42 (2006.01)
G03B 27/32 (2006.01)
G03B 27/68 (2006.01)
G03B 27/54 (2006.01)
G03B 27/72 (2006.01)
G03B 27/62 (2006.01)
G03F 1/00 (2012.01)

(52) U.S. Cl. .......... 355/55; 355/52; 355/53; 355/67; 355/71; 355/75; 355/77; 430/5

(58) Field of Classification Search .......... 355/52, 355/53, 55, 67–75, 77; 250/492.1, 492.2, 250/492.22, 548; 430/5, 22, 30, 311, 8, 312, 430/322; 356/124, 127, 399–401
See application file for complete search history.

(56) References Cited

U.S. PATENT DOCUMENTS

| | | | | |
|---|---|---|---|---|
| 5,308,721 A * | 5/1994 | Garofalo et al. | ................... | 430/5 |
| 5,362,585 A * | 11/1994 | Adams | .............................. | 430/30 |
| 5,821,013 A * | 10/1998 | Miller et al. | ....................... | 430/5 |
| 5,969,441 A | 10/1999 | Loopstra et al. | | |
| 6,013,395 A * | 1/2000 | Matsuura | ........................... | 430/5 |
| 6,046,792 A | 4/2000 | Van Der Werf et al. | | |
| 6,130,750 A * | 10/2000 | Ausschnitt et al. | ........... | 356/401 |
| 6,171,739 B1 * | 1/2001 | Spence et al. | .................... | 430/30 |
| 6,440,616 B1 * | 8/2002 | Izuha et al. | ........................ | 430/5 |

(Continued)

FOREIGN PATENT DOCUMENTS
EP 1256849 A1 11/2002
(Continued)

OTHER PUBLICATIONS

English translation of JP 05-066554, which was published on Mar. 19, 1993.*

(Continued)

*Primary Examiner* — Peter B Kim
*Assistant Examiner* — Christina Riddle
(74) *Attorney, Agent, or Firm* — Pillsbury Withrop Shaw Pittman LLP

(57) ABSTRACT

A method of measuring a lithographic projection apparatus is described. The method includes imaging a verification mark of a patterning device onto a radiation-sensitive layer held by a substrate table of a lithographic apparatus, wherein the verification mark includes at least a first, a second and a third verification structure that have a mutually different sensitivity profile for a dose setting, a focus setting and a contrast setting.

26 Claims, 15 Drawing Sheets

U.S. PATENT DOCUMENTS

| | | | |
|---|---|---|---|
| 6,472,766 B2 * | 10/2002 | Xiao | 257/797 |
| 6,479,904 B1 * | 11/2002 | Maejima | 257/797 |
| 6,633,390 B2 * | 10/2003 | Shiode et al. | 356/620 |
| 6,667,139 B2 | 12/2003 | Fujisawa et al. | |
| 6,701,512 B2 * | 3/2004 | Sutani et al. | 716/53 |
| 6,777,139 B2 | 8/2004 | Baselmans | |
| 7,916,284 B2 | 3/2011 | Dusa et al. | |
| 2001/0010579 A1 * | 8/2001 | Nishi | 355/67 |
| 2002/0041377 A1 * | 4/2002 | Hagiwara et al. | 356/399 |
| 2002/0132173 A1 * | 9/2002 | Rolfson | 430/5 |
| 2002/0182521 A1 * | 12/2002 | Fujisawa et al. | 430/22 |
| 2003/0104292 A1 * | 6/2003 | Tomimatu | 430/30 |
| 2004/0058256 A1 * | 3/2004 | Fujisawa et al. | 430/30 |
| 2005/0048378 A1 * | 3/2005 | Sato et al. | 430/5 |
| 2006/0019180 A1 * | 1/2006 | Nomura | 430/5 |

FOREIGN PATENT DOCUMENTS

| | | |
|---|---|---|
| JP | 02-220425 | 9/1990 |
| JP | 05066554 A * | 3/1993 |
| JP | 08-264409 | 10/1996 |
| JP | 10-335224 | 12/1998 |
| JP | 2002-299205 | 10/2002 |
| JP | 2003-022968 | 1/2003 |
| JP | 2004-039860 | 2/2004 |
| JP | 2008-028389 | 2/2008 |
| WO | 98/40791 A1 | 9/1998 |

OTHER PUBLICATIONS

Japanese Office Action mailed Jul. 22, 2011 in corresponding Japanese Patent Application No. 2009-094474.

* cited by examiner

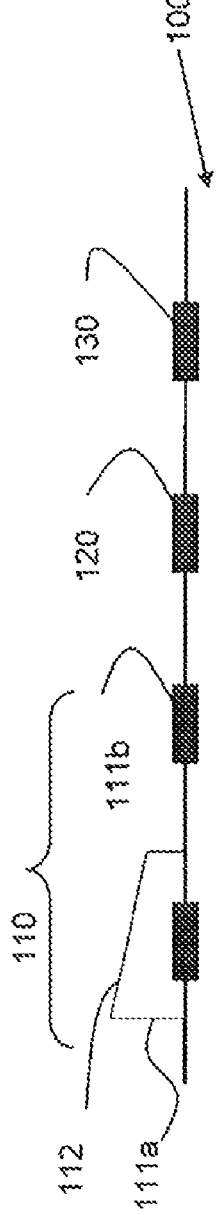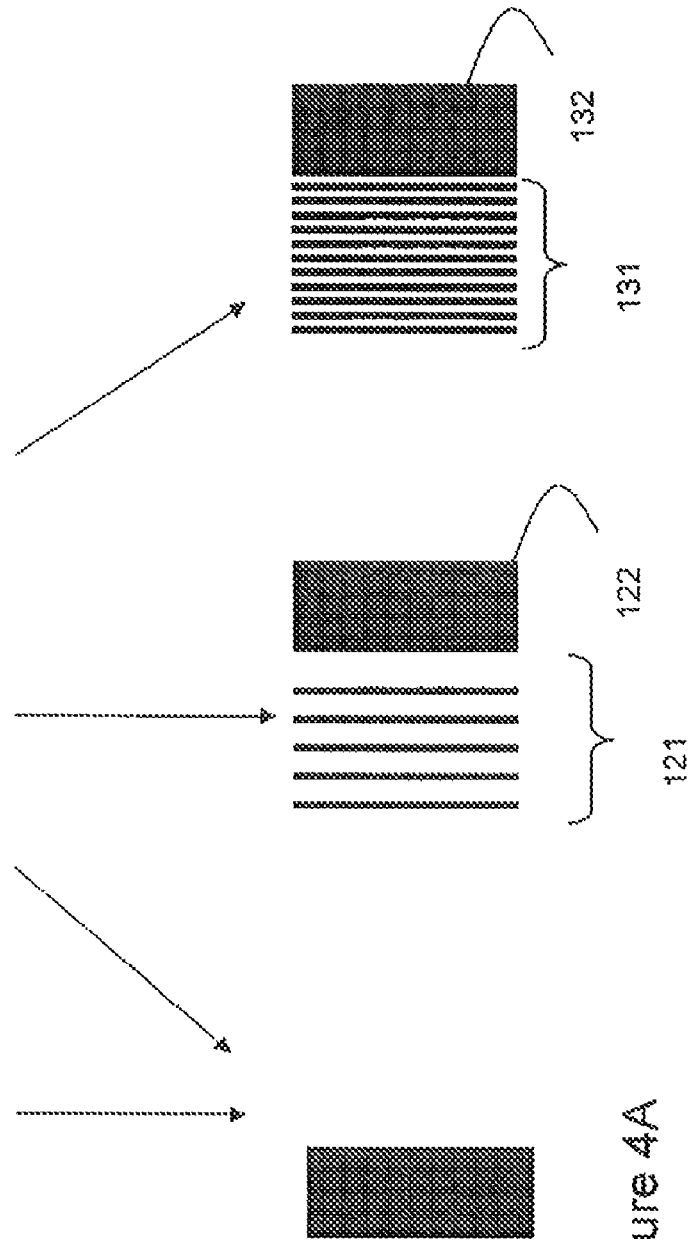

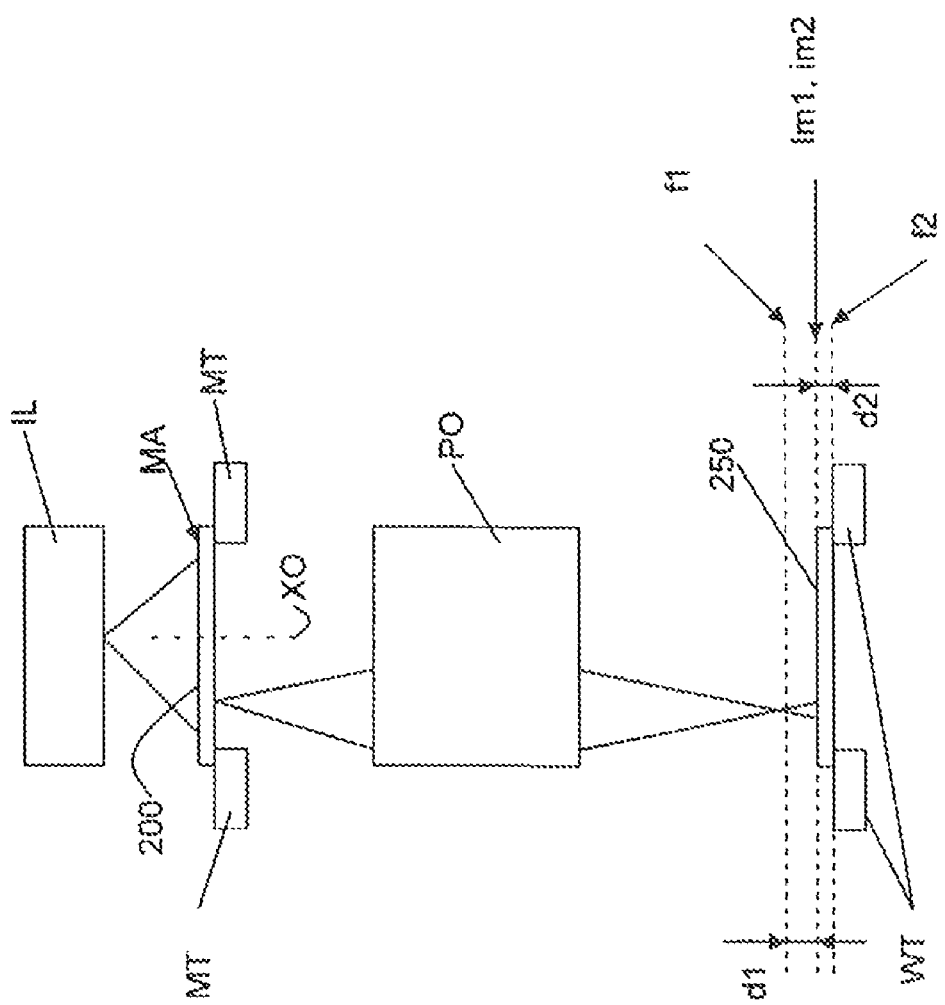

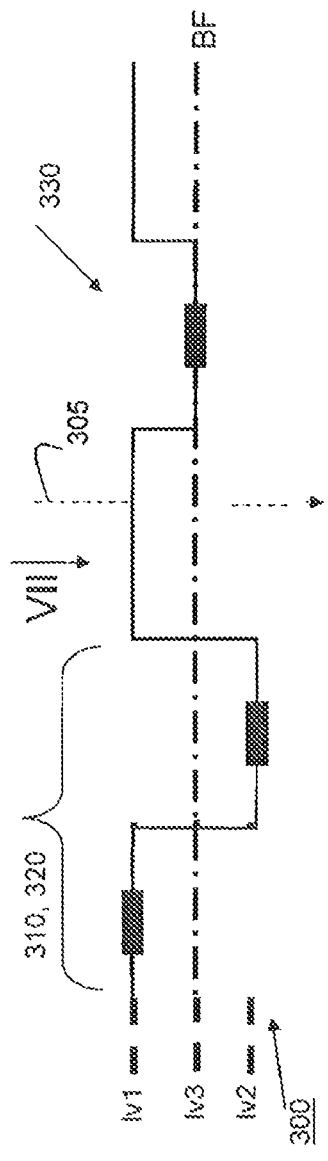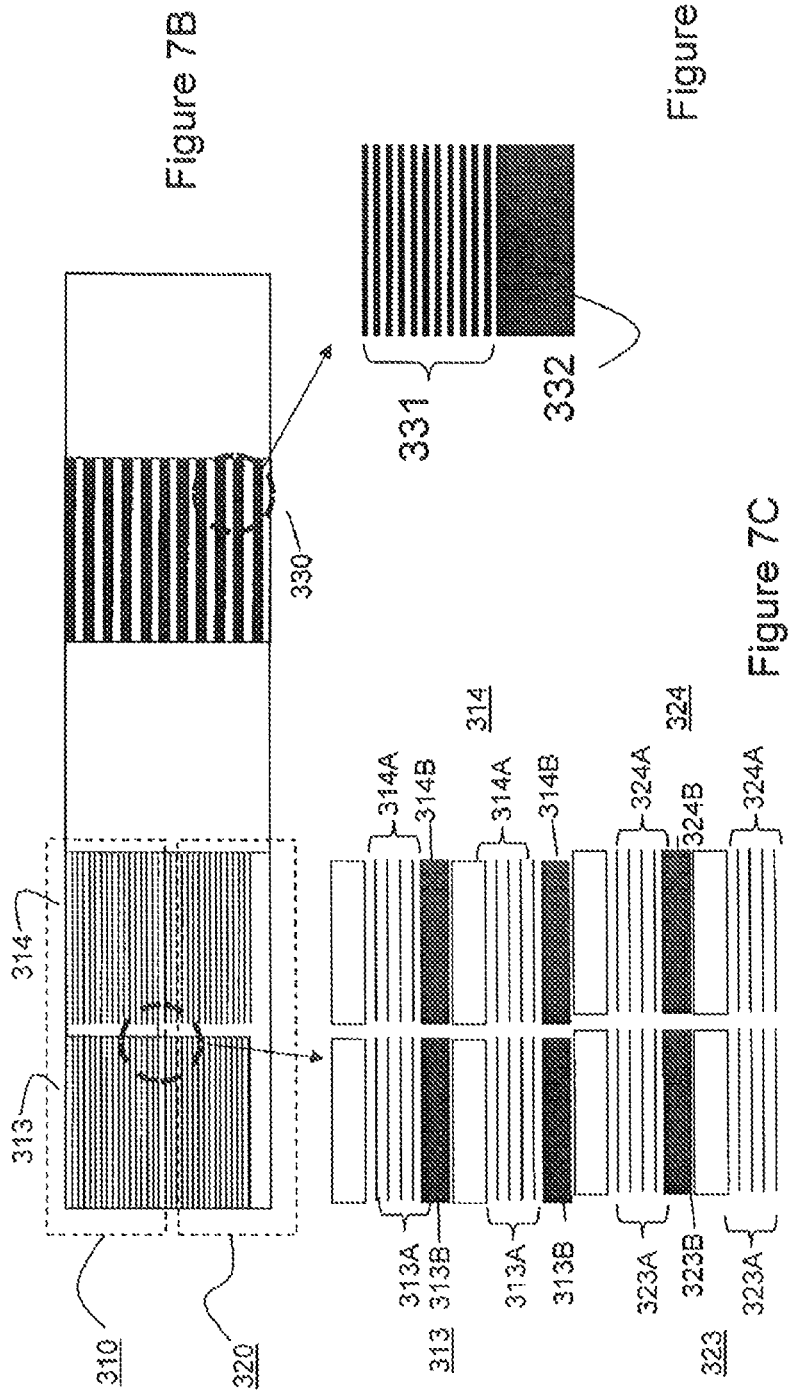

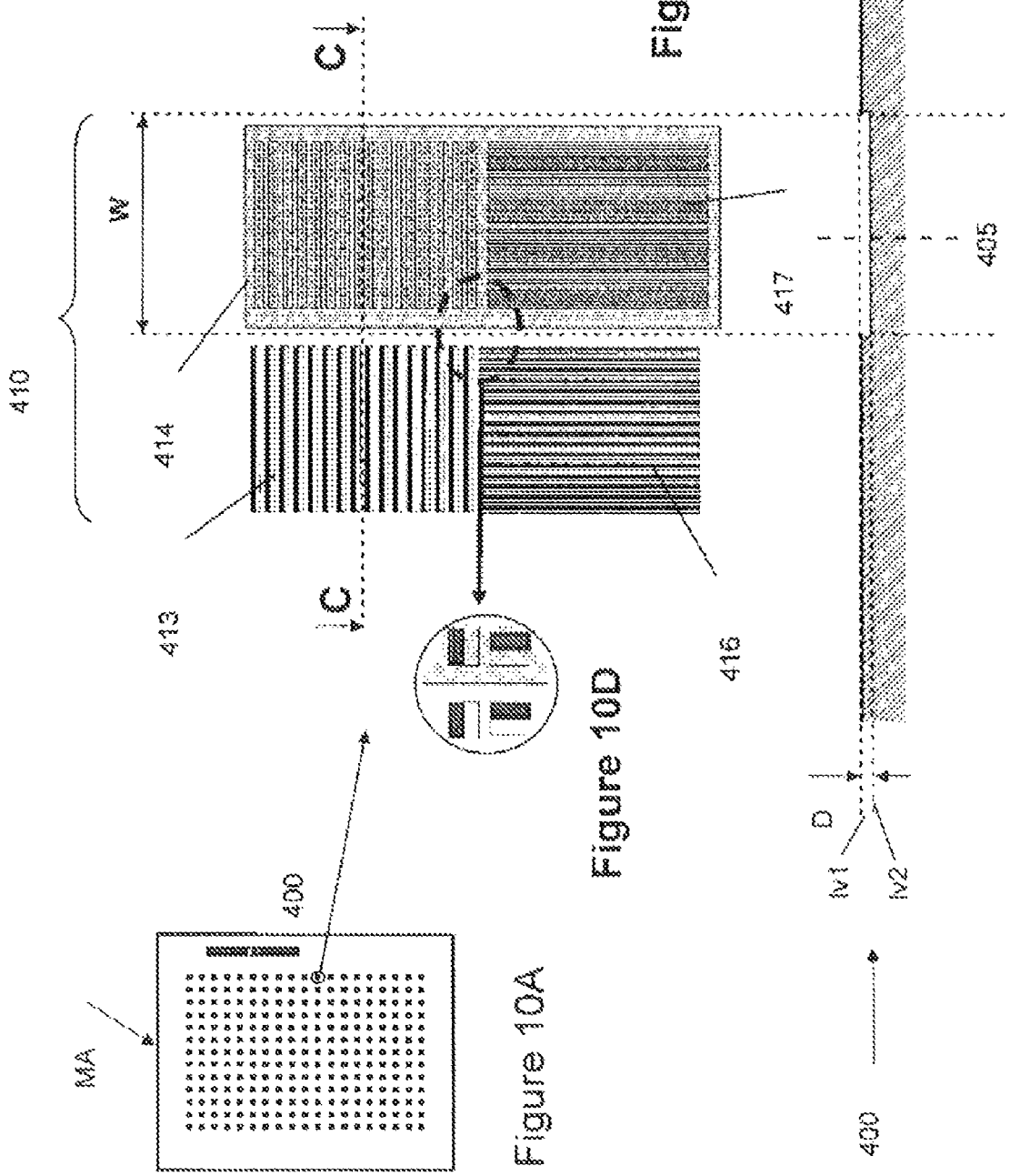

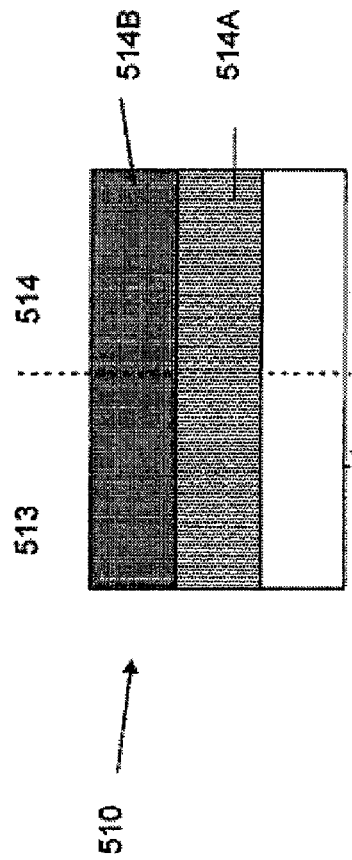
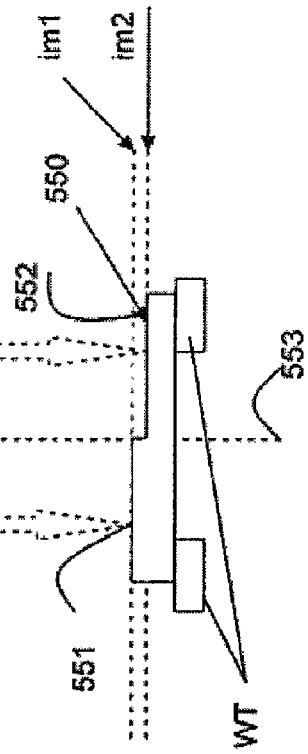
Figure 11A
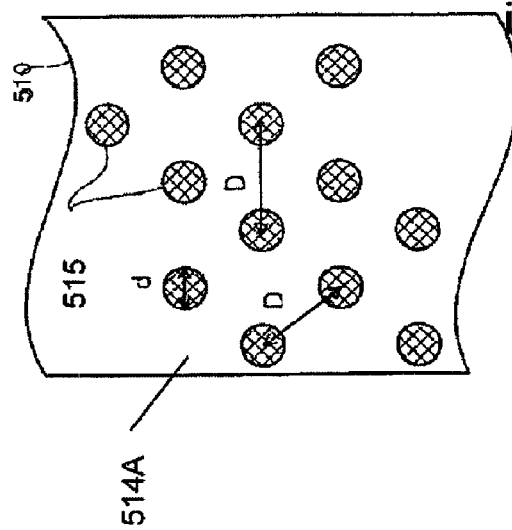
Figure 11B

METHOD OF MEASURING A LITHOGRAPHIC PROJECTION APPARATUS

This application claims priority and benefit under 35 U.S.C. §119(e) to U.S. Provisional Patent Application No. 61/071,177, entitled "A Method Of Measuring A Lithographic Projection Apparatus", filed on Apr. 16, 2008. The content of that application is incorporated herein in its entirety by reference.

FIELD

The present invention relates to a method of measuring a lithographic projection apparatus, a patterning device, a lithographic projection apparatus, a device manufacturing method, and/or a device manufactured with the device manufacturing method.

BACKGROUND

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art will recognize that the description herein also applies to other types of substrates. In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single substrate will contain a whole network of adjacent target portions that are successively irradiated via the projection system, one at a time.

In current apparatus, employing, for example, patterning using a mask on a mask table, a distinction can be made between two different types of machine. In one type of lithographic projection apparatus, each target portion is irradiated by exposing the entire pattern onto the target portion at once; such an apparatus is commonly referred to as a stepper. In a further apparatus, commonly referred to as a step-and-scan apparatus, each target portion is irradiated by progressively scanning the pattern with respect to the beam in a given reference direction (the "scanning" direction) while synchronously scanning the substrate table parallel or anti-parallel to this direction. Since, in general, the projection system will have a magnification factor M (with M<1) the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. from a mask) is imaged onto a substrate that is at least partially covered by a layer of radiation-sensitive material (resist). Prior to this imaging step, the substrate may undergo various procedures, such as priming; resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system. Depending on the wavelength of the radiation used in the lithographic apparatus, the projection system may include refractive optics, reflective optics, and catadioptric systems, for example. The illumination and/or projection system may include components operating according to any of these design types for directing, shaping or controlling the beam of radiation, and such components may be referred to below, collectively or singularly, as a "lens". The wavelength of the radiation used in the lithographic apparatus may be in the UV range, e.g. 365 nm, the DUV range, e.g. 248 or 193 nm or in the EUV range, e.g. 13.5 nm. The position of a second element traversed by the beam relative to a first element traversed by the beam will for simplicity hereinafter be referred to as "downstream" of or "upstream" of the first element. In this context, the expression "downstream" indicates that a displacement from the first element to the second element is a displacement along the direction of propagation of the beam; similarly, "upstream" indicates that a displacement from the first element to the second element is a displacement opposite to the direction of propagation of the beam. Further, the lithographic apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application publication no. WO 98/40791, incorporated herein by reference.

There is a desire, for example, to integrate an ever-increasing number of electronic components in an IC. To realize this it is necessary to decrease the size of the components and therefore to increase the resolution of the projection system, so that increasingly smaller details, or line widths, can be projected on a target portion of the substrate. As the critical dimension (CD), i.e. the dimension of a feature or features, such as the gate width of a transistor, in which variations will cause undesirable variation in physical properties of the feature, in lithography shrinks, consistency of focus, both across a substrate and between substrates, becomes increasingly important. Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy settings were determined from examination of those test structures.

U.S. patent application no. U.S. 60/996,506 describes a method of measuring a uniformity of focus of a lithographic projection apparatus. The method includes exposure of a photoresist covered test substrate with a plurality of verification fields. Each of the verification fields includes a plurality of verification marks, and the verification fields are exposed using a certain focus offset FO. After developing, an alignment offset for each of the verification marks is measured and translated into defocus data using a transposed focal curve.

The use of a verification method to monitor focus and energy settings was disclosed in European patent application publication no. EP 1 256 849. The verification method includes imaging a verification mark onto a radiation-sensitive layer. The verification mark includes a grating and has at least a first part and a second part. The apparent imaged position of the first part is predominantly sensitive to the focus setting and the apparent imaged position of the second part is predominantly sensitive to the dose setting. The verification mark is first calibrated by determining the sensitivity of its image for certain dose and focus settings. By subsequently measuring the shifts in apparent position of the first and the second parts in the lithographic apparatus, the relative focus setting and the relative dose setting can be determined, so that the lithographic apparatus can be verified.

SUMMARY

In addition to the focus setting and the dose setting, a pattern imaged at the substrate may be influenced by a contrast setting. A change in contrast setting may result, for example, from a relative movement of the aerial image with respect to the substrate during exposure of the image, or from imperfections in the optical system. Until now it is believed that there is no method to determine such a contrast setting. It would be desirable to have a verification method that makes it possible to determine the individual contributions of contrast, dose and focus setting.

According to an aspect of the invention, a method of measuring a lithographic projection apparatus, the method including imaging a verification mark provided in a patterning device onto a radiation-sensitive layer held by a substrate table of a lithographic apparatus, wherein the verification mark includes at least a first, a second and a third verification structure that have a mutually different sensitivity profile for a dose setting, a focus setting and a contrast setting.

Sensitivity for a setting is understood to mean that a pattern present in a verification structure forms an image that depends on the setting. For example, the verification structure includes a pattern, having lines that are imaged with a thickness depending on the setting. Accordingly the center of the lines of the image are shifted over a distance that depends on the setting. Two verification structures have a different sensitivity profile if the relative influence of the settings on the image of the verification structures is different. Even if none of the verification structures is sensitive only to the contrast setting, the contrast setting can still be determined by a comparison of the influences observed on the images of the at least three verification structures.

The first, second and third verification structures make it possible to determine the focus setting, the dose setting and the contrast setting from a geometrical parameter of the images of the verification patterns of the parts, either directly, or from a function, e.g. a linear combination, of those geometrical parameters.

A verification structure may include one or more verification patterns. A verification pattern may include a combination of a solid line and a sub-patterned line arranged along the solid line on a background. This pattern of solid line, sub-patterned line and background may be repeated to form a grating. The solid line has a first continuous optical property, the background has a second continuous optical property contrasting with the first optical property, and the sub-patterned line has a sub-pattern with first areas and second areas being distributed between each other, the first areas having the first optical property and the second areas having the second optical property. The optical property is, for example, the reflectiveness or the transmissivity of the surface. If the verification method includes forming an image by transmission through the verification mark the transmissivity is considered the first optical property. If an image is formed by reflection at the verification mark the reflectivity is considered the first optical property. Two surfaces have a "contrasting optical property" if one thereof is substantially reflective and the other substantially is not, in that it substantially absorbs and/or transmits the radiation. Two surfaces also have a "contrasting optical property" if one thereof is substantially transmissive and the other surface substantially is not, e.g. substantially absorbs and/or reflects the radiation.

The dimension of the patterns to be used is related to the critical dimension. The critical dimension relates to the wavelength $\lambda$ and the numerical aperture NA of the optical system as follows:

$CD = k \cdot \lambda / NA$, wherein k is a dimensionless factor in the range of 0.25-0.5.

In the context of an embodiment of the present invention, a dense sub-pattern includes features having a width in the order of the CD, and has a pitch in the order of two to four times the CD. Similarly, a sparse sub-pattern includes features of a width of the order of the CD, and has a pitch in the order of four or more times the CD.

The verification mark may, for example, have a first verification structure having an image that is sensitive to a focus setting, a second verification structure having an image that is sensitive to a focus setting, a contrast setting and a dose setting, and a third verification structure having an image that is sensitive to a dose setting.

The third verification structure may include a densely sub-patterned verification pattern. The image of a densely sub-patterned verification pattern, i.e. a pattern having a pitch in the order of two to four times the CD, is only sensitive to the dose applied. The first sparsely sub-patterned verification pattern is sensitive to each of the three parameters—dose, contrast and focus. By measuring the shift $\Delta 1$, $\Delta 2$, $\Delta 3$ observed for the patterns in each of the verification structures, the settings for dose, contrast and focus can be derived. The setting for the dose is derived directly from the shift $\Delta 3$ observed for the pattern of the third verification structure. If the first verification structure is merely focus sensitive, the focus setting is derived from the shift $\Delta 1$ of the verification structure and the contrast setting can be determined from a linear combination of the shifts $\Delta 1$, $\Delta 2$, $\Delta 3$ of the patterns of the first, the second and the third verification structures. If the first verification structure is also sensitive for other settings, the focus setting can be determined from a first linear combination of the observed shifts $\Delta 1$, $\Delta 2$, $\Delta 3$ and the contrast setting can be determined from a second linear combination thereof.

In an embodiment, the first verification structure includes at least a pair of verification patterns, one of the verification patterns covered by an element to cause a deviation of an incident radiation beam, each of the verification patterns having the same focus setting. According to this method, also known as a Level Verification Test (LVT), a change in focus setting causes a shift of the images of this pair of patterns. The element to cause the deviation in the radiation beam can be, for example, a prism. A phase shift method, such as PSFM, may be used as an alternative to the LVT method to determine the focus setting.

Dependent on the type of a verification pattern, e.g. whether it is sub-patterned, and in what manner, the measured position of its image on the radiation sensitive layer may depend both on the applied radiation dose (and contrast) and on a difference in position of the plane where the pattern is imaged with respect to the position of the focal plane for the pattern and on the contrast. The radiation sensitive layer is, for example, a photographic emulsion, a radiation sensitive surface of a substrate, or the surface of an electronic camera, e.g. a CCD device. In practice the measured position is a substantially monotonic function of the dose and the contrast, and a parabolic function of the deviation of the difference in position.

In an embodiment, the first verification structure includes at least a first and a second verification pattern having mutually different focus settings, and the third verification structure has a focus setting centrally within the range of focus settings of the first and the second verification patterns.

According to the verification method of an embodiment of the present invention, a focus offset between the first and the second verification patterns is used to separate focus effects on the one hand and dose effects and contrast effects on the other hand. A common mode verification shift is caused by a dose variation and/or a contrast variation. The amount of defocus is derived from the difference in shift between the patterns. If the substrate table is displaced in an axial direction, the magnitude of one of the first and the second differences will increase, while the other of the first and the second differences will decrease. Consequently the difference in shift between the patterns is indicative for the deviation of the amount of focus offset. This has an advantage that for obtaining an accurate focus measurement, the type of pattern used is less important, as effects on the shift caused by other influences than the focus setting are cancelled out.

As discussed in European patent application publication no. EP 1256849, dependent on the type of sub-pattern the verification pattern is more focus-sensitive or more dose-sensitive. Accordingly, to determine the focus-offset, the first verification structure may include at least a first and a second verification pattern with a sub-patterned line that includes a hexagonal array of dots having the first optical property within an area having the second optical property. The pitch D between dots may, for example, be in a range of $3\lambda/NA$ to $12\lambda/NA$ e.g. and the dot diameter d may, for example, be in a range of $1\lambda/NA$ to $4\lambda/NA$, wherein $\lambda$ is the wavelength of the radiation used in the lithographic apparatus, and NA is the numerical aperture of the projection optics. Accordingly for a wavelength in the EUV-range, of e.g. 13.5 nm and a numerical aperture of 0.5, a favorable choice would be a pitch D of 167 nm and a dot diameter d of 56 nm.

The dose sensitive pattern may include dots having a diameter in a range of $0.1$-$0.5\lambda/NA$, e.g. a diameter d1 of 12 nm for the abovementioned wavelength and numerical aperture.

When the image of the verification pattern on the radiation-sensitive layer is correctly focused, the dots having the first optical property will be imaged in the developed resist and will result in a more pronounced area adjacent the area corresponding to the solid line than would be the case for poorly focused dots, so that there will be an apparent shift in the measured position of the developed verification mark. As the image of the verification-pattern moves out of focus the effective diameter of the imaged spots will reduce. Thus the center of gravity of the imaged verification pattern will shift so that a verification offset is observed. It should be noted that the density of the focus-sensitive part must be kept below the threshold at which iso-focal behavior occurs. Above that threshold and above certain energy, no focus-sensitive behavior is observed. The density and energy at which iso-focal behavior is observed can be calculated or determined experimentally.

In an embodiment, the sub-patterned line is sub-patterned as a plurality of sub-lines that are arranged parallel with a solid line. In that case the sub-lines in the sub-patterned line of the focus-sensitive verification pattern have a pitch D, in a range of $4*CD$ to $10*CD$ for example, and the line width d may, for example, be in a range of $0.75*CD$ to $1.5*CD$. For a wavelength in the EUV-range, of e.g. 13.5 nm and a numerical aperture of 0.5, and a constant $k=0.35$ the critical dimension is approximately 9 nm. Accordingly, a favorable choice would be a pitch D of 54 nm and a line width d of 9 nm. The sensitivity for focus setting is improved with decreasing line width. In an embodiment, the dose sensitive pattern may include lines arranged with a pitch of $2*CD$ to $4*CD$, e.g. a pitch of 27 nm for the above mentioned wavelength and numerical aperture.

According to an aspect of the invention the verification mark includes at least a first verification structure with at least a first verification pattern, the verification structure being imaged at mutually different focus settings.

This may be realized in various ways. For example the first verification pattern of the first verification structure may be imaged more than one time at a different focus setting. Alternatively the first verification structure with the first verification pattern and the image plane may be moved in a direction of the optical axis relative to each other, for example according to a periodic, e.g. a sine function. In an embodiment, however, the first verification structure further includes a second verification pattern that is imaged at a focus setting differing from that of the first verification pattern.

A difference in focus setting between the first and the second verification pattern can be realized in various ways. This combination of a first and a second verification pattern having a mutually different focus-setting may also be used separately, if it is only desired to determine the focus. Also this combination may be used to determine both focus and dose setting, if the contrast setting is constant.

According to an embodiment, the projection system used for imaging is provided with an astigmatic projection error wherein the difference is determined between the first and the second verification patterns at the radiation-sensitive layer, i.e. the difference of shift in position between the images of the first and the second verification patterns. Provided that the astigmatic projection error has an axis that is aligned more with one of the verification patterns than with the other one of the verification patterns there will be a difference in the location of the focal planes for the first and the second verification patterns. Accordingly the verification patterns will be imaged in a plane of a radiation sensitive layer with a different focus-offset. From the apparent relative shift of the imaged patterns the focus setting at the plane of the radiation sensitive layer can be determined. The method may, for example, be applied in a projection system that has a first and a second mirror with an astigmatic deviation, such that the deviations of the mirrors mutually compensate each other during normal operation and reinforce each other during the verification situation.

According to an embodiment, a length of an optical path from the first verification pattern to the image of the first verification pattern at the radiation sensitive layer differs from a length of an optical path from the second verification pattern to the image of the second verification pattern at the radiation sensitive layer.

A difference in optical path length may be introduced in an embodiment wherein the first and the second verification patterns are arranged at a first and a second level in a direction of an axis transverse to a plane of the verification mark. This has an advantage that a single additional part suffices to provide the desired test image of the verification mark.

A difference in optical path length may be obtained in an embodiment by imaging the first and the second verification patterns at the radiation-sensitive layer at a respective first and second level in a direction transverse to a plane of the radiation sensitive layer. A combination of these methods would be possible too, but this would be more complicated.

In order to determine the dose, a patterning device according to an embodiment of the invention may have the second verification structure include a third and a fourth verification pattern, that are arranged at a first and a second level in a direction transverse to a plane of the verification mark, and wherein the fourth verification pattern has an orientation with respect to the third verification pattern that is rotated substantially 180 degrees around the axis. Due to the fact that the fourth verification pattern is rotated by substantially 180 degrees, the difference in shift in the observed location of the images of the third and the fourth verification patterns is substantially determined by the dose and contrast setting and substantially independent of the focus setting. One of the verification patterns of the first verification structure may coincide with a verification pattern of the second verification structure. In an embodiment the verification mark may have a first combination of verification patterns for determining the focus setting, and a second combination of verification patterns for determining the dose setting. In the embodiment the verification mark may have a row of three verification patterns, wherein the middle one of these three verification patterns is arranged at a level different from the other two, and wherein the middle one of the patterns is used with one of the other two patterns to determine the focus setting, and is used with the other of the other two patterns to determine the dose setting. To have an optimal sensitivity for the combination of dose and contrast setting a verification mark may be used wherein the second verification structure has a third and a fourth verification pattern, have a sub-patterned line having a surface gradually changing from the first optical property at a side adjoining the solid line to the contrasting optical property at the opposite side of the sub-patterned line. This may be achieved in that the sub-patterned line has a sub-pattern of dots with the first optical property at a background of the second optical property, such that the density of the dots gradually decreases in a direction away from the solid line. The size of the dots may be, for example, such as would image as dots of about ½λ on the radiation sensitive layer, where the wavelength of the beam is λ and the numerical aperture of the projection system is 0.6.

In order to detect and determine contrast differences between imaged features having mutually different directions the patterning device may further have an additional first verification structure that includes an additional first and an additional second verification pattern that are arranged at a third and a fourth level in a direction transverse to a plane of the verification mark and that have an orientation with respect to the first verification pattern that is rotated substantially 90 degrees around the axis.

For ease of manufacturing the third level desirably coincides with the first level and the fourth level coincides with the second level.

According to a further aspect of the invention, a patterning device configured to pattern a beam of radiation in a lithographic projection apparatus according to a desired pattern, the patterning device including a verification mark, wherein the verification mark includes at least a first, a second and a third verification structure that have a mutually different sensitivity profile for a dose setting, a focus setting and a contrast setting. A patterning device including a plurality of verification marks distributed over the patterning device, e.g. in a matrix arrangement makes it possible to detect relative focus, dose and contrast settings over the plane of the target portion.

According to a still further aspect a lithographic projection apparatus is provided including:

a substrate table configured to hold a substrate;

a patterning device configured to pattern a beam of radiation according to a desired pattern, the patterning device including a verification mark to be imaged onto a radiation-sensitive layer held by the substrate table, wherein the verification mark includes at least a first, a second and a third verification structure that have a mutually different sensitivity profile for a dose setting, a focus setting and a contrast setting;

a projection system configured to image the patterned beam onto the radiation-sensitive layer.

According to a still further aspect a device manufacturing method is provided including:

using a patterning device to endow a beam of radiation with a pattern in its cross-section;

projecting the patterned beam of radiation onto a substrate that is at least partially covered by a layer of radiation-sensitive material using a lithographic apparatus; and prior to the projecting, verifying the lithographic apparatus using any of the method described above.

BRIEF DESCRIPTION OF THE DRAWINGS

These and other aspects are described in more detail with reference to the drawing. Therein:

FIG. 4 shows an embodiment of a verification mark in more detail,

FIGS. 4A, 4B, 4C shows respective verification structures of the embodiment of the verification mark of FIG. 4 in still more detail;

FIG. 6 shows a method of imaging a verification mark at a radiation sensitive layer;

FIG. 7A shows an embodiment of a verification mark in cross-section;

FIG. 7B shows a top-view of the verification mark according to direction VII in FIG. 7A;

FIG. 7C shows detail of a first and a second verification structure of the verification mark of FIGS. 7A and 7B;

FIG. 7D shows a detail of a third verification structure of the verification mark of FIGS. 7A and 7B;

FIG. 10A shows a patterning device according to an embodiment of the invention;

FIG. 10B shows a verification mark within the patterning device;

FIG. 10C shows a cross-section according to line C-C through FIG. 10B;

FIG. 10D schematically shows a first section in the mark of FIG. 10B;

FIG. 11A shows a method of imaging a verification mark at a radiation sensitive layer;

FIG. 11B shows a detail of the mark shown in FIG. 11A;

DETAILED DESCRIPTION

Figure 1:
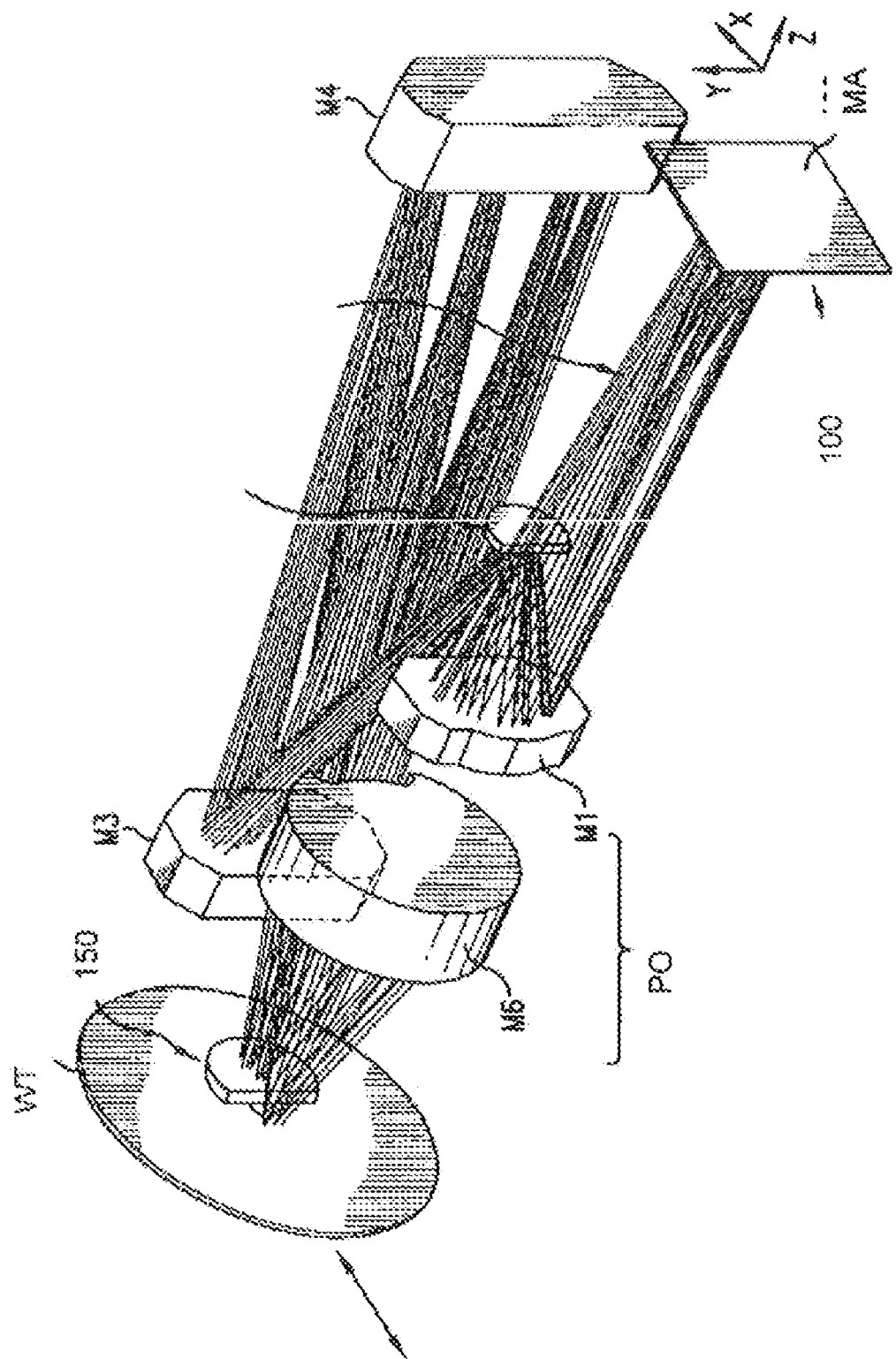
FIG. 1 schematically shows a EUV based lithographic apparatus.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention. The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Thus, the regions illustrated in the figures are schematic in nature and their shapes are not intended to illustrate the actual shape of a region of a device and are not intended to limit the scope of the invention.

It will be understood that when a layer is referred to as being "on" a layer, it can be directly on the other layer or intervening layers may be present. In contrast, when an element is referred to as being "directly on" another layer, there are no intervening layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a portion of a EUV photolithographic apparatus, which includes a radiation system to provide a beam of radiation from a EUV source (not shown in FIG. 1). The system also includes image optics (including mirrors M4 and M3), a pupil, a patterning device MA in the form of a reticle mounted on a reticle stage (not shown) with an image of a pattern to be imaged onto a substrate that is arranged on a substrate table WT, and projection optics PO including mirrors M1 and M6. The EUV radiation is then projected onto a substrate to be mounted on the substrate table WT. It will be appreciated that the patterning device MA is reflective in an EUV apparatus, unlike photolithographic apparatus operating at longer wavelengths, such as deep ultraviolet, or visible, where the patterning device MA is usually, but not always, transmissive.

As further shown in FIG. 1, in an embodiment of the present invention, a module having a radiation sensitive surface 150, e.g. a sensor or a substrate with a resist layer is placed on or is part of the substrate table WT, and the patterning device MA is provided with a verification mark 100 to measure the focus setting and/or the dose setting and/or the contrast setting.

Figure 2:
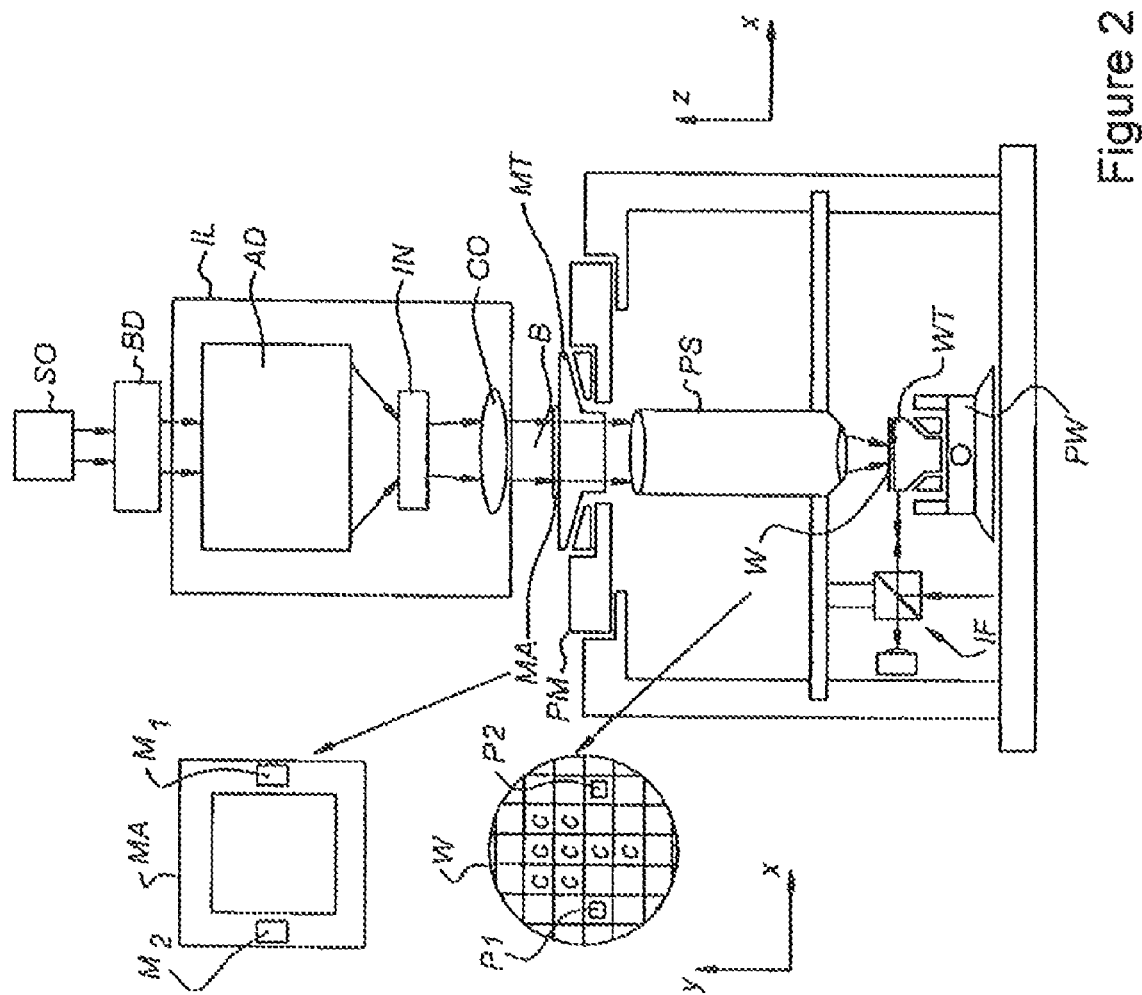
FIG. 2 schematically shows a further lithographic apparatus to explain aspects of an embodiment of the present invention.

FIG. 2 schematically depicts an example of another lithographic projection apparatus which may be used in conjunction with an embodiment of the invention. The apparatus includes:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator IL may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the patterning device table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device table MT and the substrate table WT are scanned synchronously while a pattern imparted to the radiation beam is projected onto a target portion C (i.e. a single dynamic exposure). The velocity and direction of the substrate table WT relative to the patterning device table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The settings of focus and dose of radiation have a significant influence on the pattern that is formed in the radiation sensitive layer of the substrate. Likewise, the contrast of the image formed at the radiation sensitive layer may influence the pattern that is formed. This influence is in particular important for a lithographic apparatus that operates in the scan mode. In that case the contrast is dependent on the curvature of the surface of the substrate.

Likewise, for the purpose of verification the patterning device MA may be provided with one or more verification marks 100.

Figure 3A:
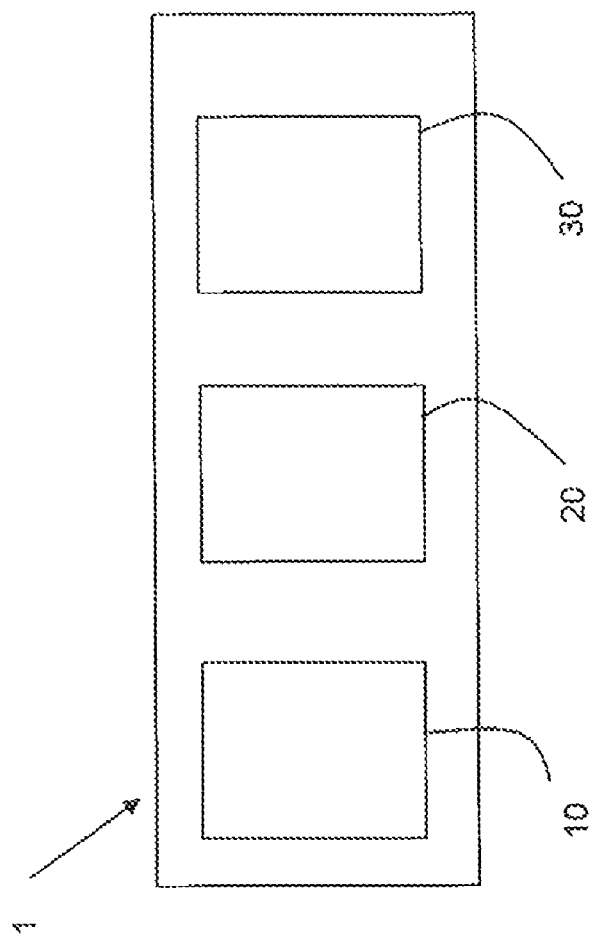
FIG. 3A schematically shows one of the verification marks.
Figure 3:
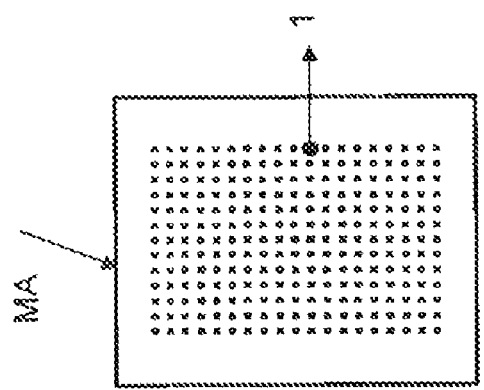
FIG. 3 shows a patterning device with verification marks.

In the embodiment shown in FIG. 3, the patterning device MA has a plurality of verification marks 1 that are regularly arranged in a rectangular grid.

FIG. 3A shows one verification mark 1 in more detail. The verification mark 1 includes at least a first, a second and a third verification structure 10, 20, 30 that have a mutually different sensitivity profile for a dose setting, a focus setting and a contrast setting. In an embodiment each of the verification structures 10, 20, 30 can be sensitive to each of these settings, but relatively to a different extent. By observation of a shift of each of the verification structures 10, 20, 30, and a comparison of the observed shifts, the relative contributions of focus, dose and contrast can be derived.

FIG. 4 shows an embodiment of a verification mark 100 in cross-section in more detail.

The verification mark 100 includes at least a first, a second and a third verification structure 110, 120, 130 respectively, that have a mutually different sensitivity profile for a dose setting, a focus setting and a contrast setting. In the embodiment shown the first verification structure 110 includes at least a pair of verification patterns 111a, 111b. The verification patterns are shown in more detail in FIG. 4A. The pattern as shown in FIG. 4A is a line having a width substantially larger, e.g. at least 10 times larger than the wavelength of the radiation used. For example for a wavelength of 13.5 nm, the line may have a width of 150 nm. The pattern shown may be repeated with a distance between the lines for example in the same order of magnitude as the thickness of the lines, or larger. The line(s) are desirably not sub-patterned. One of the verification patterns, here 111*a*, is covered by an element 112, e.g. a prism or a phase shift mask to cause a deviation of an incident radiation beam.

The image of the first verification structure 110 on the radiation sensitive surface 150 is substantially only sensitive to a focus-setting. A test using this structure is known as such as a Level Verification Test (LVT).

In the embodiment shown, the second verification structure 120 includes a sparsely sub-patterned line 121, as is shown in more detail in FIG. 4B. The line 121, has a width substantially larger, e.g. more than 20 times the wavelength of the radiation, e.g. 7.2 μm. The line 121 is sparsely sub-patterned, in that it is partitioned in sub-lines having a pitch D, in a range of 4*CD to 10*CD. The width d may for example, be in a range of 0.75*CD to 1.5*CD. For a wavelength in the EUV-range, of e.g. 13.5 nm, a numerical aperture of 0.5, and a constant k=0.35, the critical dimension is approximately 9 nm. Accordingly, a favorable choice would be a pitch D of 54 nm and a line width d of 9 nm. The second verification structure 120 further includes a solid reference line 122 having a width substantially larger than the wavelength of the radiation used, e.g. 5.8 μm. The pattern formed by sub-pattered line 121 and solid line 122 may be repeated, e.g. with a period of 17-25 μm. This second verification structure 120 is sensitive for each of the focus, dose and contrast settings.

In an embodiment, the sub-patterned line is sub-patterned as a plurality of sub-lines that are arranged parallel with the solid line. In that case the sub-lines in the sub-patterned line of the focus-sensitive verification pattern have a pitch D, in a range of 4*CD to 10*CD for example 150 nm, and the line width d may, for example, be in a range of 0.75*CD to 1.5*CD. For a wavelength in the EUV-range, of e.g. 13.5 nm, a numerical aperture of 0.5, and a constant k=0.35, the critical dimension is approximately 9 nm. Accordingly, a favorable choice would be a pitch D of 54 nm and a line width d of 9 nm. The sensitivity for focus setting is improved with decreasing line width. In an embodiment, the dose sensitive pattern may include lines arranged with a pitch of 2*CD to 4*CD, e.g. a pitch of 27 nm for the above mentioned wavelength and numerical aperture.

The third verification structure 130 includes a densely chopped line 131 as is shown in FIG. 4C. The verification structure 130 further includes a solid reference line 132. The line 131 is densely chopped in that it is composed of sub-lines arranged with a pitch of 2*CD to 4*CD, e.g. a pitch of 27 nm for the above mentioned wavelength and numerical aperture.

In the embodiment shown the solid line 132 has a width of 5.8 μm, the densely chopped line 131 has a width of 7.2 μm. The sub-lines of the chopped line 131 have a width, for example, in the range of 0.2-0.4 μm. This pattern of solid line, sub-patterned line and background may be repeated to form a grating. The solid line 132 has a first continuous optical property in that it is fully reflective, the background between the solid and the chopped lines 132, 131 has a second continuous optical property contrasting with the first optical property in that it absorbs all radiation, and the chopped line 131 has a sub-pattern with first areas, the sub-lines and second areas (the remaining area between the sub-lines) being distributed between each other. The first areas, the sub-lines have the first optical property, hence they are also reflective and the second areas have the second optical property, they absorb the radiation.

Figure 5:
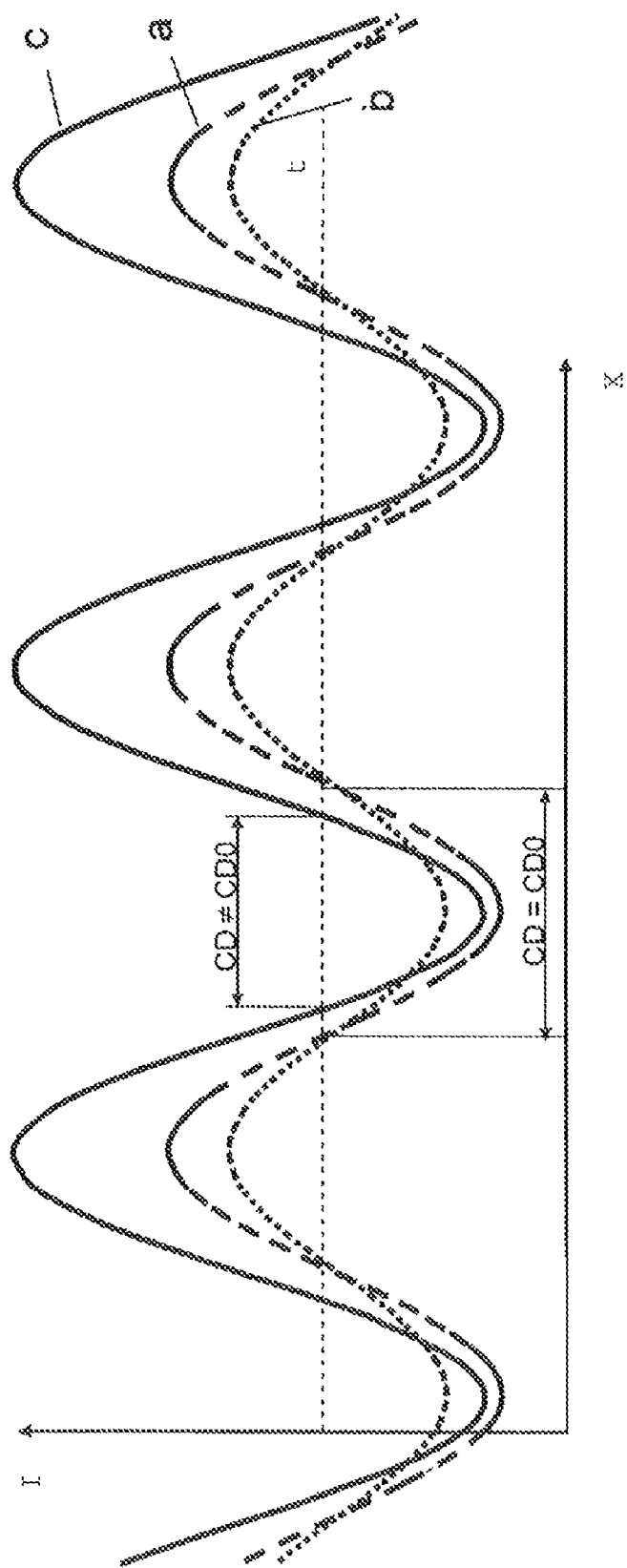
FIG. 5 shows an intensity profile of an aerial image of a verification structures with a dense verification pattern under various circumstances.

FIG. 5 shows the aerial image intensity for the densely chopped line pattern. The striped curve a shows the image formed at the optimal dose, contrast and focus setting. The dashed curve b shows the aerial image intensity in case of an out of focus setting or a degraded contrast. It can be seen that this has no consequences for the critical dimension CD for this pattern. In both cases the critical dimension has a value CD0. As is shown by curve c in FIG. 5, the third verification structure 130 is substantially only sensitive to the dose setting.

Accordingly the first, second and the third verification structures 110, 120, 130 have a different sensitivity profile, in that the first verification structure 110 is substantially only sensitive to the focus setting, the second verification structure 120 is sensitive to each of the dose setting, the focus setting and the contrast setting, and the third verification structure 130 is substantially only sensitive to the dose setting. By a computation on the basis of the observed shifts for the three structures, the contrast setting can be computed. The computation is relatively simple, in that the two of the structures are only sensitive for only a respective one of the settings.

In the previous embodiment a first verification structure 110 is used that is known as such in the LVT method. FIG. 6 schematically illustrates a new and inventive method of measuring a focus setting in a lithographic projection apparatus. For the purpose of describing this method the lithographic projection apparatus is shown here as a transmissive system. It will be clear to the skilled person that an embodiment of the invention is equally applicable to a reflective system as used for EUV applications.

The lithographic projection apparatus includes:

a radiation system IL for providing a beam of radiation;

a support structure MT for supporting patterning device MA, the patterning device serving to pattern the beam according to a desired pattern;

a substrate table WT for holding a substrate; and a projection system PO for imaging the patterned beam onto a target portion of the substrate.

The method includes imaging a verification mark 200 provided in the patterning device MA onto a radiation-sensitive layer 250 held by the substrate table WT. The verification mark 200 is arranged in a plane transverse to an axis XO, and the first verification structure has at least a first and a second verification pattern that have a mutually different focus setting. The projection system PO has a respective first and second focal plane f1, f2 for these patterns. The first and second verification patterns are imaged at a respective first and second image plane im1, im2 at the radiation-sensitive layer 250. In the embodiment shown the first and the second image plane coincide. A difference d1 between the first focal plane and the first image plane deviates in magnitude and/or sign from a difference d2 between the second focal plane and the second image plane. For clarification, this difference is strongly exaggerated in the drawing. In practice the height level may correspond to approximately half to ⅔ of the width of the verification offset focus sensitivity curve. This is in a region where the verification offset focus sensitivity curve is at half its height, where the curve is substantially linear. This depends on the depth of focus (DOF). In a practical example the height difference is, for example, a few μm, e.g. 3 μm on the patterning device level. This corresponds in this embodiment to a height difference of 150 nm at substrate level.

This method for determining focus can be used independently. The method is favorable in that the ratio between the relative shift measured between the verification patterns of the first verification structure and the shift in focus-setting is relatively high. FIGS. 7A-7C illustrates how a first verification structure 310 according to this method can be used in combination with a second and third verification structure

320, 330 to determine a contrast setting. In FIGS. 7A-7C, parts corresponding to those in FIG. 4 have a reference number that is 200 higher.

FIG. 7A shows, in cross-section, a part of patterning device according to an embodiment having a verification mark 300 with a first verification structure 310, a second verification structure 320 and a third verification structure 330. FIG. 7B shows a top-view of the part of the patterning device according to direction VII in FIG. 7A. In FIG. 7B, it can be seen that the first verification structure 310 includes a first and a second verification pattern 313, 314 that are arranged at mutually different levels lv1, lv2 respectively, in a direction 305 transverse to a plane of the verification mark. The third verification structure 330 is arranged at a level lv3, between the levels of the first and the second verification pattern 313, 314. Accordingly when the verification mark 300 is imaged at a radiation sensitive layer, a length of an optical path from the first verification pattern 313 of the first verification structure 310 to the image of that verification pattern at the radiation sensitive layer differs from a length of an optical path from the second verification pattern 314 of the first verification structure to the image of the second verification pattern at the radiation sensitive layer 250. Hence, the first and the second verification patterns 313, 314 have mutually different focus settings, while the third verification structure 330 has a focus setting centrally within the range of focus settings of the first and the second verification patterns 313, 314.

Likewise the second verification structure 320 has a third and a fourth verification pattern 323, 334 that are arranged at a different levels lv1, lv2 respectively.

FIG. 7C shows a detail of the first, the second, the third and the fourth verification patterns 313, 314, 323, 324.

As can be seen in FIG. 7C, the first verification pattern 313 includes sparsely chopped lines 313A in combination with solid lines 313B. In the embodiment shown each sparsely chopped line 313A has a width of 7.2 µm, and is chopped into sub-lines having a width of 9 nm with a pitch of 150 nm. The solid lines 313B have a width of 5.8 µm. The pattern of sparsely chopped line 313A and solid line 313B is repeated with a pitch of 17.5 µm, so that transparent lines having a width of 4.5 µm are formed therebetween.

Likewise, the second verification pattern 314 includes sparsely chopped lines 314A in combination with solid lines 314B, the third verification pattern 323 includes sparsely chopped lines 323A in combination with solid lines 323B, and the fourth verification pattern 324 includes sparsely chopped lines 324A in combination with solid lines 324B.

As schematically shown in FIG. 7D, the third verification structure 330 includes a densely chopped line 331 next to a solid line 332. In the embodiment shown the solid line 332 has a width of 5.8 µm and the densely chopped line 331 has a width of 7.2 µm. The densely chopped line is chopped into sub-lines having a width for example in the range of 8-12 nm and having a pitch 18-36 nm. A plurality of such verification marks 300 may be arranged in a matrix at a patterning device as is shown schematically in FIG. 3 for example.

The method of verifying the lithographic apparatus shown in FIG. 6, with a patterning device MA having a verification mark 300 as described with reference to FIGS. 7A-7D is now discussed in more detail.

Figure 8A:
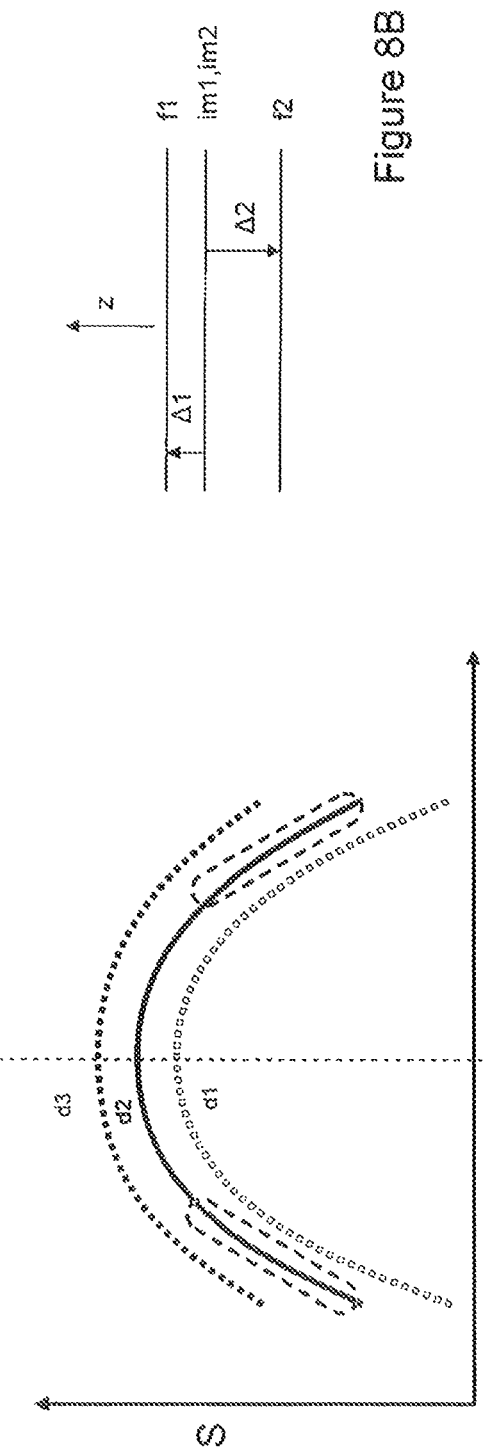
FIG. 8A shows a relation between a relative position of an image of a verification structure and the setting of focus and dose.

When the image of the first verification pattern 313 is correctly focused on the radiation sensitive layer, the sub-lines of the chopped line 313A will be imaged in the developed resist and will result in a more pronounced area adjacent the image of the printed solid line 313B than would be the case for poorly focused sub-lines, so that there will be an apparent shift in the measured position of the developed verification pattern 313. As the image of the verification pattern 313 moves out of focus, the effective width of the imaged sub-lines will reduce. Thus the center of gravity of the imaged verification pattern 313 will shift so that a verification offset is observed. The same applies to the verification pattern 314. FIG. 8A shows the effect of the dose (d1<d2<d3) and the focus setting (Δ) on the detected shift S of the verification pattern 313. An increase in contrast has the same effect as an increase in the dose. As can be seen therein the measured position S is a substantially monotonic increasing function of the dose. The position S is further a substantially parabolic function of the focus setting Δ, being the difference between the level of the focal plane and the image plane for the verification pattern.

Figure 8B:
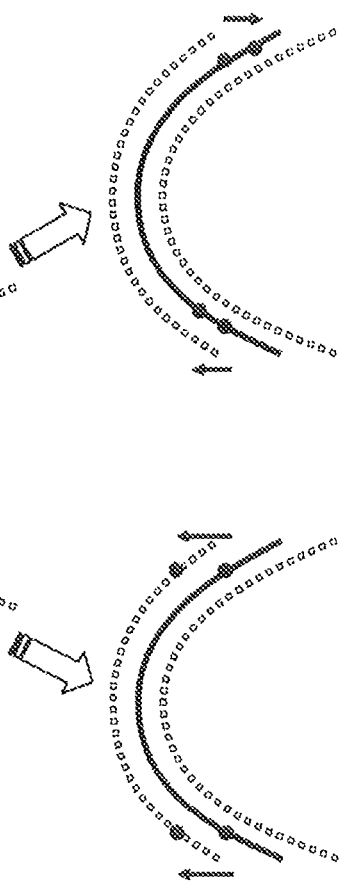
FIG. 8B shows the relation between a focal plane and an image plane.

FIG. 8B schematically shows the image plane im1, im2 and the focus planes f1, f2 for the verification patterns 313, 314 respectively. If the image plane im1, im2 is exactly between the first and the second focus plane f1, f2, the images of the verification patterns 313, 314 will have no relative displacement and will have a shared reference position. If the radiation sensitive layer 250 is displaced in the direction z, the difference Δ1 will decrease, and the difference Δ2 will increase. Accordingly, the images of the first and the second verification patterns 313, 314 will move away from this reference position in mutually opposite directions. This is shown schematically in the lower right part of FIG. 8C. Therewith the relative displacement of the images of the first and the second verification pattern 313, 314 with respect to each other is indicative for the location of the focal plane f with respect to the image planes im1, im2.

Figure 8C:
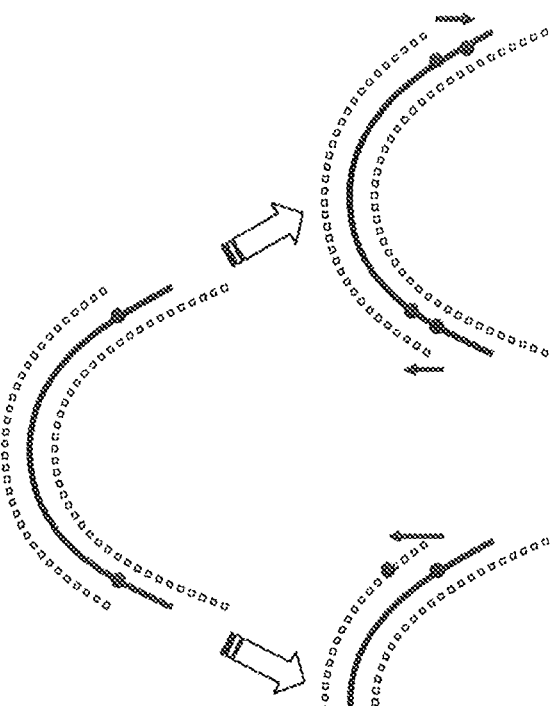
FIG. 8C schematically illustrates how the dose setting and the focus setting can be obtained independently from the curve shown in FIG. 8A.

However if the dose or the contrast is varied the images of the first and the second verification patterns 313, 314 will shift in the same direction, as illustrated in the lower left half of FIG. 8C. Accordingly the relative displacement between the images of these patterns is substantially independent of the dose and the contrast. It should be noted that the density of the focus-sensitive part must be kept below the threshold at which iso-focal behavior occurs. Above that threshold and above a certain energy, no focus-sensitive behavior is observed. The density and energy at which iso-focal behavior is observed can be calculated or determined experimentally.

Figure 9:
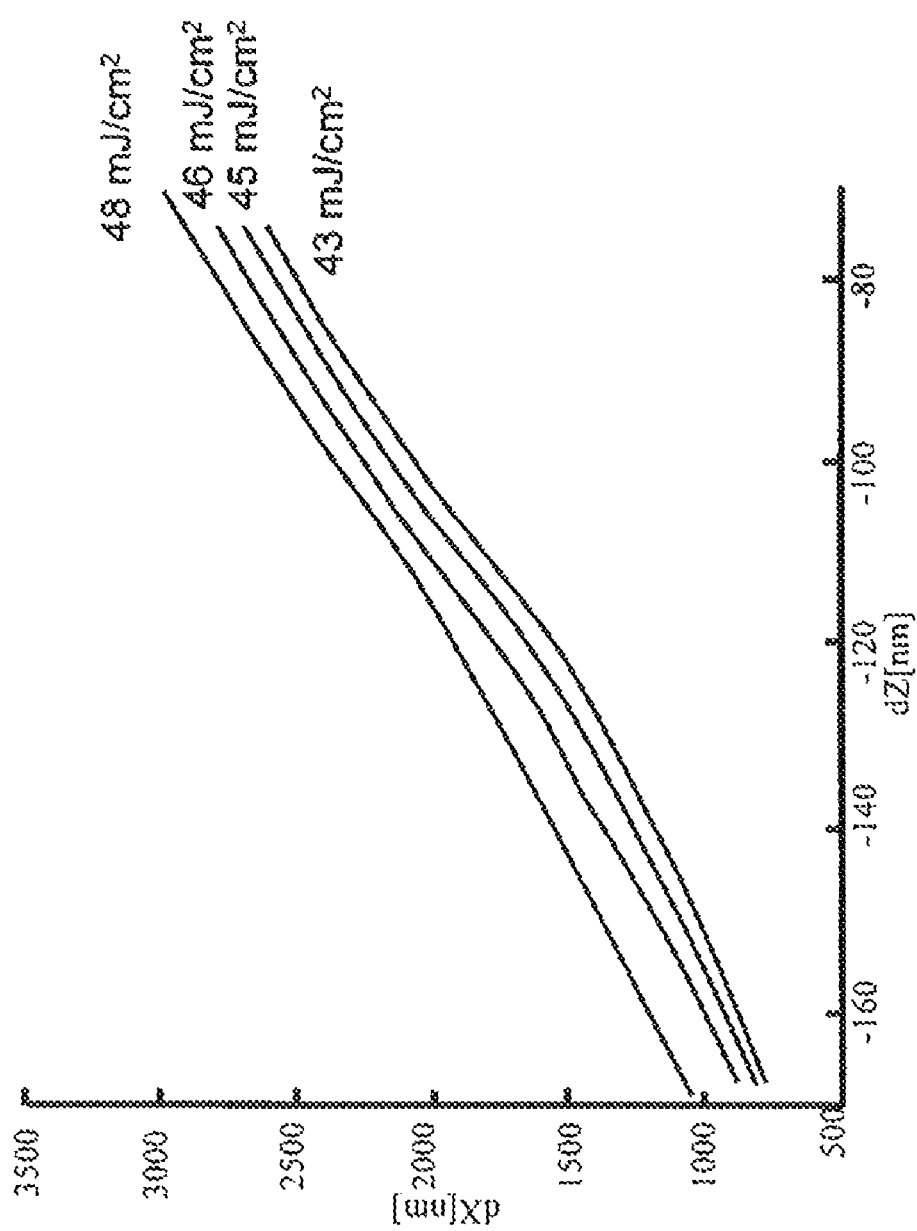
FIG. 9 shows a linear part of a calibration curve obtained with a first verification structure shown in FIG. 7C.

FIG. 9 shows the shifts dX observed as a function of the amount of defocus dZ for various applied doses in a range of 43-48 mJ/cm². In the second verification structure 320, in the fourth verification pattern 324, the chopped line 324A is arranged at a side of the solid line 324B opposite to the side of solid line 323B at which the chopped line 323A is arranged in the third verification pattern 323. Accordingly, the fourth verification pattern 324 has an orientation with respect to the third verification pattern 323 that is rotated substantially 180 degrees around the axis 305 perpendicular to the plane of the drawing and corresponding to axis 305 in FIG. 7A. In this embodiment a change of focus setting will have the effect that the images of the verification patterns 323, 324 on the image planes at the radiation sensitive layer 250 will shift in the same direction. Accordingly the relative position of these images is substantially independent of the focus setting.

However, a change in radiation dose or a change of the contrast will cause a shift of the images of the verification patterns 323 and 324 at the radiation sensitive layer in mutually opposite directions. Accordingly the second verification structure is both contrast and dose sensitive.

Although the verification patterns 323 and 324 are shown arranged against each other, these patterns may be separated by a background zone to prevent interference between the patterns.

As described with reference to FIG. 4, the third verification structure 330, having the dense chopped line pattern is sensitive to dose variations, but substantially insensitive to contrast variations. As the first, second and the third verification structures have a mutually different sensitivity profile, the contrast setting can be determined from a combination of the shifts observed for the three verification structures.

A further embodiment of a verification mark 400 is shown in FIGS. 10A-10D. The verification mark 400 may be extended with a third verification structure, but may also be used separately. FIG. 10A shows a plurality of the verification marks 400 arranged in a matrix on a patterning device MA configured to pattern a beam of radiation in a lithographic projection apparatus according to a desired pattern. One mark 400 is shown in more detail in FIG. 10B. As shown therein the mark 400 includes a first verification structure 410 formed by a first and a second verification pattern 413, 414. The first and the second verification patterns 413, 414 are similar to the first and the second verification patterns 313, 314 of FIG. 7C. As shown in FIG. 10C, the cross-section according to line C-C in FIG. 10B, the first and the second verification patterns 413, 414 are arranged at a first and a second level lv1, lv2 in a direction of an axis 405 transverse to a plane of the verification mark 400. In particular, the second verification pattern 414 is arranged in a groove having a width W and a depth D of the verification mark 400. In the embodiment shown the groove has a width W of 1000 μm and a depth D of 3 μm.

As the second verification pattern 414 is arranged at a level different from the first verification pattern 413, the first and the second verification patterns 413, 414 have a different focus setting. FIG. 10D schematically shows a corner between verification patterns 413, 414, 416 and 417. As shown schematically FIG. 10D, the first and the second verification patterns 413, 414 of the first verification structure 410 have substantially the same orientation.

If the focal setting is such that a level exactly between the first and the second levels lv1, lv2 would be correctly focused on the image plane, then the focal planes for the first and the second verification patterns 413, 414 have a deviation from the image plane of the same magnitude. In that case the imaged patterns share a common reference position.

If the focal setting is changed, the images of the first and the second verification patterns 413, 414 will move away from the reference position in mutually opposite directions. Therewith the relative displacement of the images of the first and the second verification patterns 413, 414 with respect to each other is indicative for the focal setting. The relative displacement of the images however is substantially insensitive to dose variations.

The verification mark 400 includes further verification patterns 416, 417 of an additional first verification structure that are also arranged at a first and a second mutually different level lv1, lv2 in a direction of the axis 405. However, the verification patterns 416, 417 are rotated by 90 degrees relative to the verification patterns 413, 414. The relative displacement of the images of these patterns 416, 417 is a second indication of the focus setting. If the focal system PO has an astigmatic error, the relative displacement for images of the patterns 416, 417 will differ from the relative displacement for images of the patterns 413, 414. This information can be used to control the focal system PO.

After a current dose setting or a current focus setting is determined from a measured difference verification between the image of the first and the second verification patterns, settings and/or parameters of the apparatus can be adjusted to adapt the dose setting or focus setting.

Referring to FIG. 11A, in order to realize a difference in focus setting between the first and the second verification patterns 513, 414, it is not necessary that the verification patterns 513, 514 are arranged at a different level in the verification mark. As shown in FIG. 11A, the verification patterns 513, 514 may be imaged at different image planes 551, 552 respectively along the axis 553 onto the radiation sensitive layer 550. Analogously, the verification patterns of a second verification structure may be imaged with different focus settings, by using multiple image planes.

In this case the solid line 514B has a first continuous optical property in that it is fully reflective, the background has a second continuous optical property contrasting with the first optical property in that it absorbs all radiation, and the sub-patterned line 514 has a sub-pattern with first areas 515 and second areas (the remaining area) being distributed between each other. The first areas 515 have the first optical property, hence they are also reflective and the second areas have the second optical property, they absorb the radiation.

It is not necessary that the chopped lines 514 are chopped into sub-lines. The chopped lines 514A may be chopped into other sub-patterns. In the embodiment shown, the sub-patterned line 514A includes a hexagonal array of reflecting dots 515 within an otherwise radiation absorbing area. As an order of magnitude, the pitch between the dots may be in a range of 3-12λ/NA, and a size of the dots may be in a range of 1-4λ/NA, wherein λ is the wavelength used and NA is the numerical aperture of the projection system. For example, for a wavelength λ of 13.5 nm and a numerical aperture of 0.5, the pitch D between dots may, for example, be 167 nm and the dot diameter d may, for example, be 56 nm.

Figure 12:
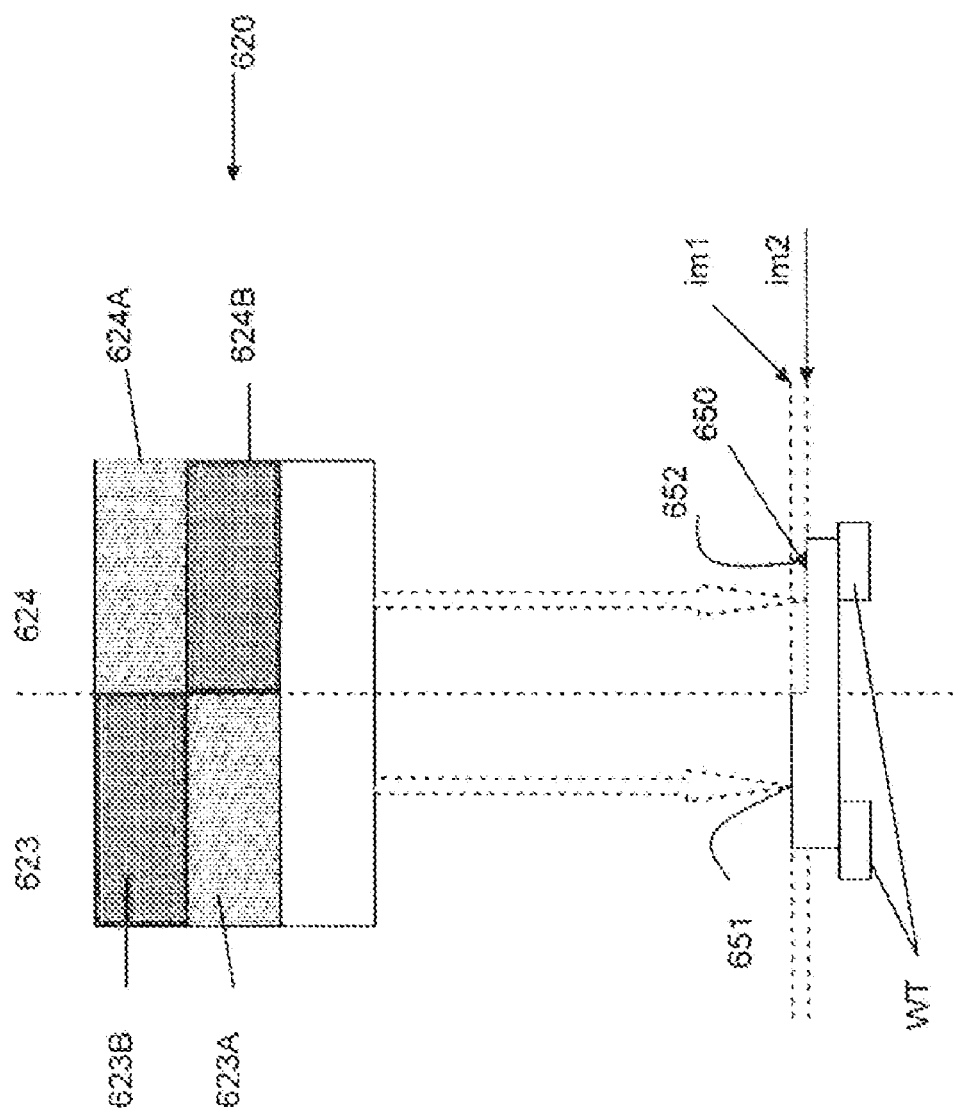
FIG. 12 shows imaging of a verification mark according to the method shown in FIG. 11A.

Analogously a second verification structure 620 may be imaged at a multilevel radiation sensitive layer as shown in FIG. 12.

Parts of the second verification structure 620 corresponding to those in FIG. 7C have a reference number that is 300 higher. Parts of the radiation sensitive layer 650 corresponding to those in FIG. 11A have a reference number that is 100 higher. In this embodiment a change of focus setting will have the effect that the images of the verification patterns 623, 624 on the image planes 651, 652 will shift in the same direction. Accordingly the relative position of these images is substantially independent of the focus setting. However, a change in radiation dose or in the contrast will cause a shift of the images of the verification patterns 623 and 624 at their image planes 651, 652 in mutually opposite directions. This makes it possible to accurately determine the dose from the relative shift of the images of these patterns 623, 624 without being disturbed by inaccuracies in the focus setting, provided that the contrast setting is known. If the contrast setting is not known, the dose setting can be determined in combination with two other verification structures having mutually different sensitivity profiles.

Figure 13:
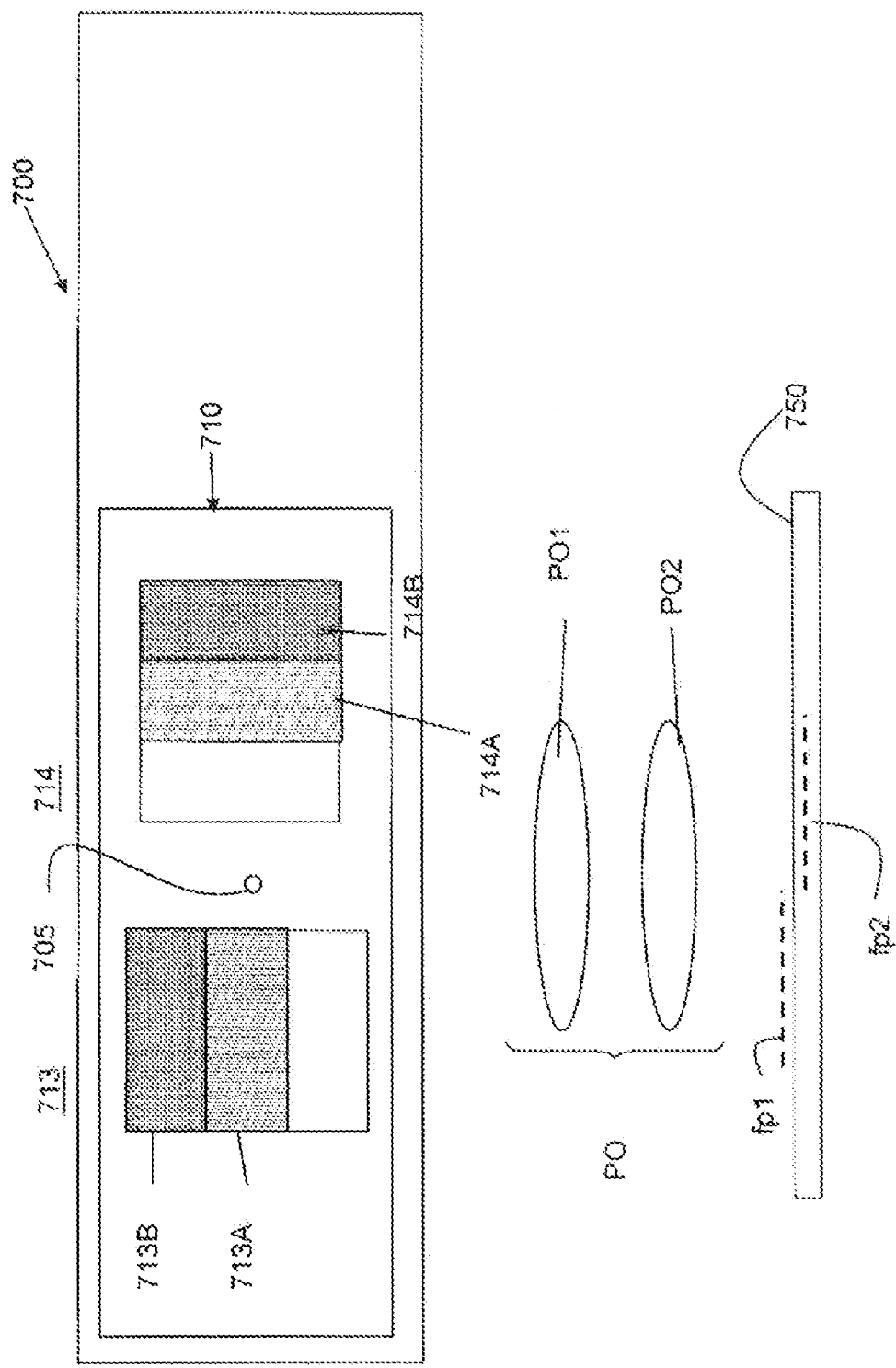
FIG. 13 shows a method of imaging a verification mark at a radiation sensitive layer.

FIG. 13 shows a further method according to the invention. According to this method a presence of astigmatism in the focal system can be used to determine the focal setting. According to this method, a verification mark 700 is used that has a first verification structure 710 with a first and a second verification pattern 713, 714 that have an orientation differing by 90 degrees from each other. First verification pattern 713 is similar to the first verification pattern 313 in FIG. 7C. The second verification pattern 714 is similar to the first verification pattern 713, except that it is rotated by 90 degrees.

The projection system PO has an astigmatic error. This may achieved in that the projection system has a first and a second astigmatic optical component PO1, PO2, e.g. lens or mirror. During normal operation these optical components PO1, PO2 can be controlled in a position wherein they compensate each others astigmatic error. However during verification their astigmatism can be used to determine the focal setting as follows.

The optical components PO1, PO2 are controlled in an orientation wherein they at least partially not compensate each others astigmatic error. Now, if the verification mark 700 is imaged onto image plane 750, the first and the second verification patterns 713, 714 will have a different focal setting, due to their mutually different orientations, and the remaining astigmatism in the optical component PO. Accordingly, a difference between the first focal plane fp1 and the first image plane (formed by 750) for the first verification pattern 713 deviates from a difference between the second focal plane fp2 and the second image plane (also formed by the 750) for the second verification pattern 714. Hence, the image of the first verification pattern 713 and the image of the second verification pattern 714 will have a different shift from a reference position. This difference is indicative for the location of the mean focal setting, i.e. the average of the focal setting for the first verification pattern 713 and the second verification pattern 714. The verification mark 700 may have an additional first verification structure with an additional first and an additional second verification pattern oriented transverse to each other and at an angle of substantially 45 degrees relative to a respective astigmatic axis. As these additional patterns substantially have the same focal setting, their images can be used to determine dose and contrast.

Figure 14:
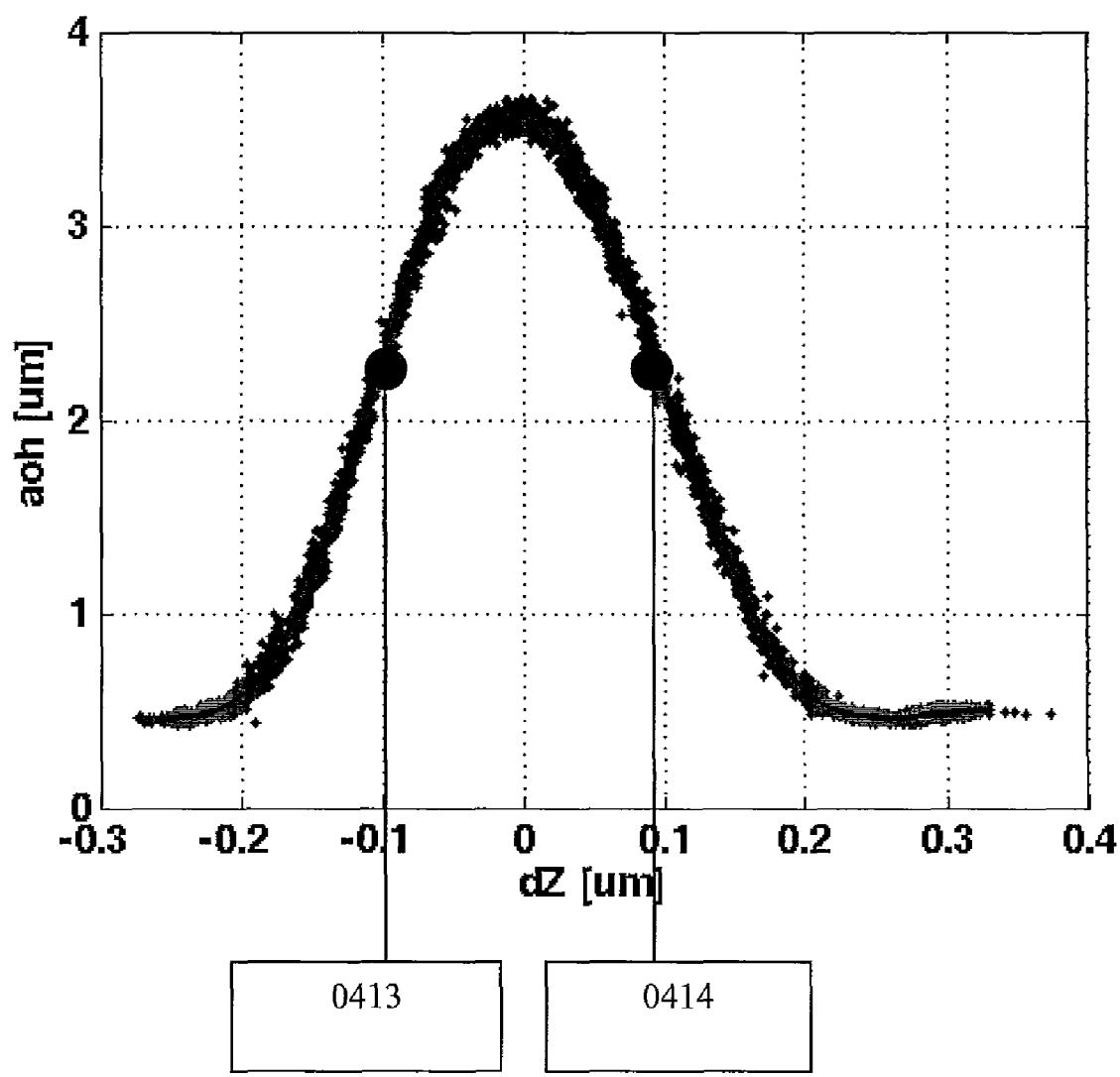
FIG. 14 shows the full curve for the measured offset for the verification mark for a particular dose setting.

FIG. 14 shows the full curve for the measured verification offset as a function of the axial position of the verification mark for a constant dose and contrast setting. The axial position of the focus for the patterns in the image plane varies substantially as a scaled linear function with the axial position of the patterns. In the present embodiment the linear function has a scale factor of about 1/20 to 1/15. FIG. 14 indicates on the left the alignment offset O413 of the image of pattern 413 and on the right the alignment offset O414 of the image of pattern 414.

FIG. 14 also indicates that the two verification patterns have exactly the same offset if the focus setting is such that the level exactly between the level of the first verification pattern 413 and the verification pattern 414 would be focused on the image plane 250 (FIG. 6).

Figure 15:
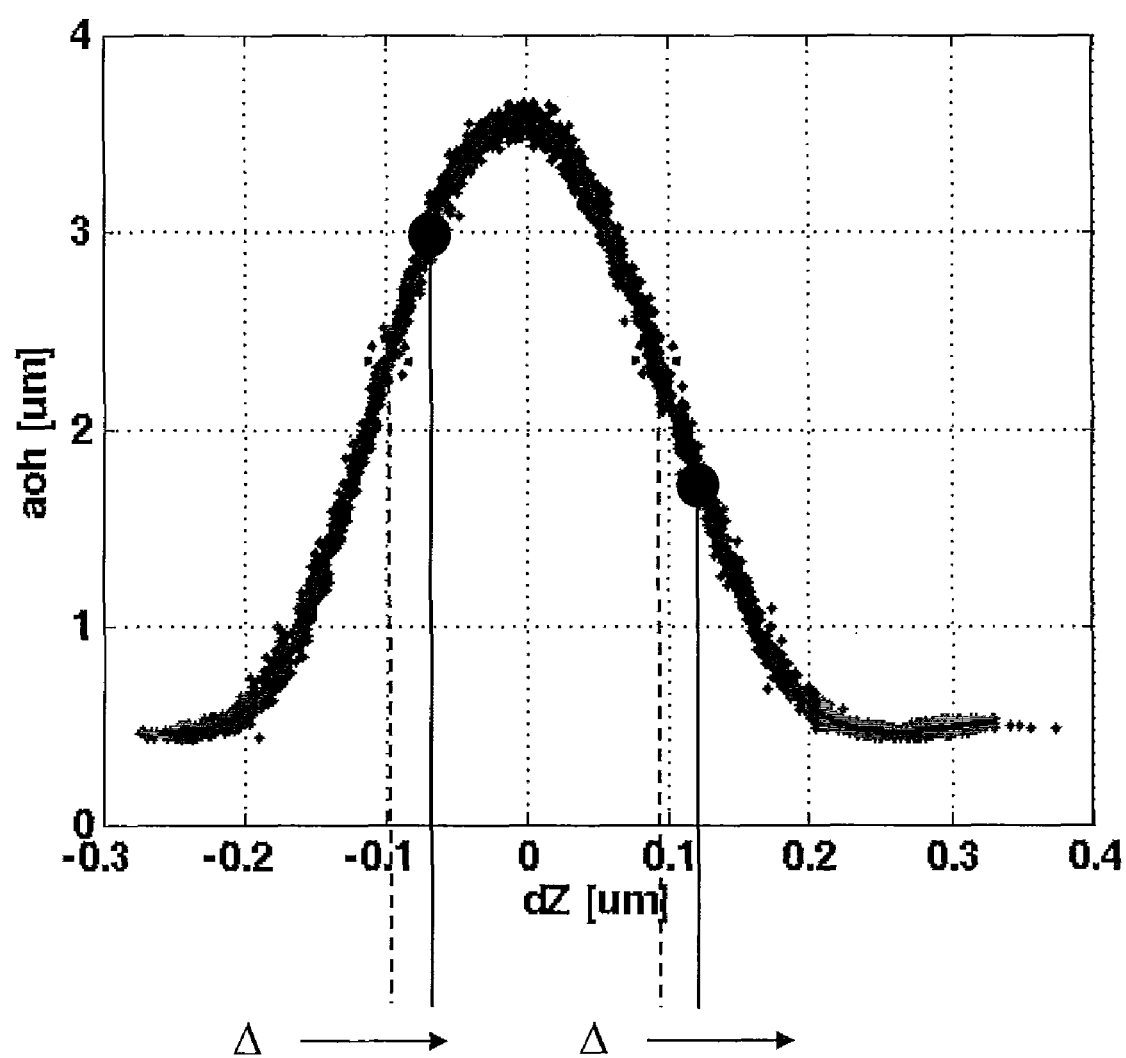
FIG. 15 shows the shift in offset if the focus setting is changed.

FIG. 15 shows the shift in verification of the images of the patterns 413, 414 if the focus setting is changed with a change Δ.

A method according to the invention may measure the position of the images using a verification system that images selected diffraction orders of radiation reflected by the images on a reference grating.

A skilled person will be capable of considering many variations within the scope of the claims. For example the verification structures having a mutually different sensitivity profile may be obtained by providing the verification structures with a verification pattern having mutually different sub-patterns and/or sub-patterns with a mutually different density. Also a multi-level verification structure may be provided with a pair of verification patterns arranged a mutually different level. In that case information may be obtained from a difference in effect on the images of these verification patterns. The verification patterns having a mutually different level may additionally have an opposite orientation. A multi-level verification structure having such mutually oppositely oriented verification patterns (a multi-level verification structure of the second type) has a different sensitivity profile than the multi-level verification structure having verification patterns with the same orientation (a multi-level verification structure of the first type). A multi-level verification structure may also be used separately, or in combination with another multi-level verification structure of the other type.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring a lithographic projection apparatus, the method comprising:
imaging a verification mark provided in a patterning device onto a radiation-sensitive layer held by a substrate table of a lithographic apparatus, wherein the verification mark comprises at least a first, a second and a third verification structure that have a mutually different sensitivity profile for a dose setting, a focus setting and a contrast setting, wherein the first verification structure comprises at least a first and a second verification pattern having mutually different focus settings, and the third verification structure has a focus setting centrally within the range of focus settings of the first and the second verification patterns.

2. The method of claim 1, wherein the third verification structure comprises a dense, sub-patterned verification pattern.

3. The method of claim 1, wherein the first verification structure comprises at least a pair of verification patterns, one of the verification patterns covered by an element to cause a deviation of an incident radiation beam.

4. The method of claim 3, wherein the element to cause the deviation is a prism.

5. The method of claim 3, wherein the element to cause the deviation is a phase shift mask.

6. The method of claim 3, wherein the second verification structure comprises a sparsely, sub-patterned verification pattern.

7. The method of claim 1, wherein the first and the second verification patterns of the first verification structure are arranged mutually transverse to each other, and wherein a projection system used in the imaging has an astigmatic projection error, and wherein a difference is determined between a shift of an image of the first verification pattern and of the second verification pattern at the radiation-sensitive layer.

8. The method of claim 1, wherein a length of an optical path from the first verification pattern of the first verification structure to the image of the first verification pattern at the radiation sensitive layer differs from a length of an optical path from the second verification pattern of the first verification structure to the image of the second verification pattern at the radiation sensitive layer.

9. The method of claim 8, wherein the first and the second verification patterns of the first verification structure are arranged at a first and a second level in a direction transverse to a plane of the verification mark.

10. The method of claim 8, wherein the first and the second verification patterns of the first verification structure are imaged at the radiation-sensitive layer at a respective first and second level in a direction transverse to a plane of the radiation sensitive layer.

11. The method of claim 1, further comprising:
verifying a current dose setting, a current focus setting, a current contrast setting, or any combination thereof from an evaluation of the image formed of the verification mark on the radiation sensitive surface; and
adjusting a setting, a parameter, or both of the apparatus to adapt the dose setting, focus setting, contrast setting, or the combination thereof.

12. A method of measuring a lithographic projection apparatus, the method comprising:
imaging a verification mark provided in a patterning device onto a radiation-sensitive layer held by a substrate table of a lithographic apparatus, wherein the verification mark comprises at least a first verification structure with at least a first verification pattern and a second verification pattern, the first and second verification patterns being imaged at mutually different focus settings, and a second verification structure having a focus setting centrally within the range of focus settings of the first and the second verification patterns.

13. The method of claim 12, wherein the first verification pattern of the first verification structure is imaged more than one time at a different focus setting.

14. The method of claim 12, wherein the first verification structure with the first verification pattern and the image plane are moved in a direction of an optical axis of the lithographic apparatus relative to each other.

15. A patterning device configured to pattern a beam of radiation in a lithographic projection apparatus according to a desired pattern, the patterning device comprising a verification mark, wherein the verification mark comprises at least a first, a second and a third verification structure that have a mutually different sensitivity profile for a dose setting, a focus setting and a contrast setting, wherein the first verification structure comprises at least a first and a second verification pattern having mutually different focus settings, and the third verification structure has a focus setting centrally within the range of focus settings of the first and the second verification patterns.

16. The patterning device of claim 15, wherein the third verification structure comprises a dense, sub-patterned verification pattern.

17. The patterning device of claim 16, wherein the first verification structure comprises at least a pair of verification patterns, one of the verification patterns covered by an element to cause a deviation of an incident radiation beam, the verification patterns having mutually the same focus setting.

18. The patterning device of claim 16, wherein the first and the second verification patterns are arranged at a first and a second level in a direction of an axis transverse to a plane of the verification mark.

19. The patterning device of claim 18, wherein the first and the second verification patterns of the first verification structure have substantially the same orientation.

20. The patterning device of claim 18, wherein the second verification structure comprises at least a third and a fourth verification pattern that are arranged at different levels in a direction of an axis transverse to a plane of the verification mark, and wherein the fourth verification pattern has an orientation with respect to the third verification pattern that is rotated substantially 180 degrees around the axis.

21. The patterning device of claim 18, further comprising an additional first verification structure with an additional first and an additional second verification pattern that are arranged at different levels in a direction of the axis, the additional first and the additional second verification pattern having an orientation with respect to the first verification pattern that is rotated substantially 90 degrees around the axis.

22. The patterning device of claim 21, wherein the additional first and the additional second verification pattern of the additional first verification structure have substantially the same orientation.

23. The patterning device of claim 21, wherein the level of the additional first verification pattern coincides with the first level and the level of the additional second verification pattern coincides with the second level.

24. A patterning device configured to pattern a beam of radiation in a lithographic projection apparatus according to a desired pattern, the patterning device comprising a verification mark, the verification mark comprising at least a first verification structure that comprises at least a first and a second verification pattern that are arranged at a mutually different level in a direction of an axis transverse to a plane of the verification mark and having mutually different focus settings, and the verification mark comprising a second verification structure having a focus setting centrally within the range of focus settings of the first and the second verification patterns.

25. A lithographic projection apparatus comprising:
a substrate table configured to hold a substrate;
a patterning device configured to pattern a beam of radiation according to a desired pattern, the patterning device comprising a verification mark to be imaged onto a radiation-sensitive layer held by the substrate table, wherein the verification mark comprises at least a first, a second and a third verification structure that have a mutually different sensitivity profile for a dose setting, a focus setting and a contrast setting, wherein the first verification structure comprises at least a first and a second verification pattern having mutually different focus settings, and the third verification structure has a focus setting centrally within the range of focus settings of the first and the second verification patterns;
a projection system configured to image the patterned beam onto the radiation-sensitive layer.

26. A device manufacturing method, comprising:
using a patterning device to endow a beam of radiation with a pattern in its cross-section;
projecting the patterned beam of radiation onto a substrate that is at least partially covered by a layer of radiation-sensitive material using a lithographic apparatus; and
prior to the projecting, verifying the lithographic apparatus by imaging a verification mark provided in a patterning device onto a radiation-sensitive layer held by a substrate table of a lithographic apparatus, wherein the verification mark comprises at least a first, a second and a third verification structure that have a mutually different sensitivity profile for a dose setting, a focus setting and a contrast setting, wherein the first verification structure comprises at least a first and a second verification pattern having mutually different focus settings, and the third verification structure has a focus setting centrally within the range of focus settings of the first and the second verification patterns.

* * * * *